(12) United States Patent
Liu et al.

(10) Patent No.: US 8,644,357 B2
(45) Date of Patent: Feb. 4, 2014

(54) HIGH RELIABILITY LASER EMITTER MODULES

(75) Inventors: Daming Liu, Tucson, AZ (US);
Edmund L. Wolak, Tucson, AZ (US);
Serge Cutillas, Tucson, AZ (US)

(73) Assignee: II-VI Incorporated, Saxonburg, PA (US)

( * ) Notice: Subject to any disclaimer, the term of this patent is extended or adjusted under 35 U.S.C. 154(b) by 185 days.

(21) Appl. No.: 13/004,679

(22) Filed: Jan. 11, 2011

(65) Prior Publication Data
US 2012/0177074 A1    Jul. 12, 2012

(51) Int. Cl.
*H01S 3/04* (2006.01)

(52) U.S. Cl.
USPC .......................................................... 372/36

(58) Field of Classification Search
USPC ........... 372/50.1, 34, 35, 36; 174/554; 438/26
See application file for complete search history.

(56) References Cited

U.S. PATENT DOCUMENTS

| | | |
|---|---|---|
| 4,428,647 A | 1/1984 | Sprague |
| 4,763,975 A | 8/1988 | Seifres |
| 4,910,539 A | 3/1990 | Mathis et al. |
| 5,049,981 A | 9/1991 | Dahringer |
| 5,127,068 A | 6/1992 | Baer |
| 5,144,486 A | 9/1992 | Hart |
| 5,168,401 A | 12/1992 | Endriz |
| 5,230,969 A | 7/1993 | Savant et al. |
| 5,243,619 A | 9/1993 | Albers et al. |
| 5,365,366 A | 11/1994 | Kafka et al. |
| 5,367,529 A | 11/1994 | Holsinger et al. |
| 5,381,859 A | 1/1995 | Minakami et al. |
| 5,446,749 A | 8/1995 | Nighan et al. |
| 5,513,201 A | 4/1996 | Yamaguchi |
| 5,579,422 A | 11/1996 | Head et al. |
| 5,691,989 A | 11/1997 | Rakuljic et al. |
| 5,740,288 A | 4/1998 | Pan |
| 5,740,292 A | 4/1998 | Strasser |
| 5,787,107 A | 7/1998 | Leger |
| 5,808,323 A | 9/1998 | Spaeth |
| 5,825,551 A | 10/1998 | Clarkson |
| 5,832,150 A | 11/1998 | Flint |
| 5,848,083 A | 12/1998 | Haden et al. |
| 5,986,794 A | 11/1999 | Krause |
| 5,999,544 A | 12/1999 | Petersen |

(Continued)

FOREIGN PATENT DOCUMENTS

| | | |
|---|---|---|
| CN | 1611969 | 5/2005 |
| JP | 05-004112 | 1/1993 |

(Continued)

OTHER PUBLICATIONS

Headley et al., Tapered Fiber bundles for combining laser pumps., Proceedings of the SPIE—The International Society for Optical Engineering, 5709(1):263-272 (200).

(Continued)

Primary Examiner — Jessica Stultz
Assistant Examiner — Tuan Nguyen
(74) Attorney, Agent, or Firm — Grand Anderson LLP

(57) ABSTRACT

Embodiments are directed to laser emitter modules, or subassemblies thereof, and methods and devices for making or using the modules. Some module embodiments are configured to provide hermetically sealed enclosures that are thermally stable during use, highly reliable in adverse environments, convenient and cost effective to manufacture or any combination of the foregoing.

36 Claims, 9 Drawing Sheets

(56) References Cited

U.S. PATENT DOCUMENTS

| | | |
|---|---|---|
| 6,044,096 A | 3/2000 | Wolak et al. |
| 6,064,515 A | 5/2000 | Yang |
| 6,084,895 A | 7/2000 | Kouchi et al. |
| 6,107,113 A | 8/2000 | Harmand et al. |
| 6,160,664 A | 12/2000 | Du et al. |
| 6,175,452 B1 | 1/2001 | Ullmann et al. |
| 6,185,235 B1 | 2/2001 | Cheng et al. |
| 6,215,598 B1 | 4/2001 | Hwu |
| 6,314,116 B1 | 11/2001 | Wright et al. |
| 6,331,692 B1 | 12/2001 | Krause et al. |
| 6,335,822 B1 | 1/2002 | Toyohara |
| 6,337,873 B1 | 1/2002 | Goering et al. |
| 6,356,380 B1 | 3/2002 | Whitney |
| 6,356,577 B1 | 3/2002 | Miller |
| 6,389,198 B2 | 5/2002 | Kafka et al. |
| 6,396,857 B1 | 5/2002 | Lambranche et al. |
| 6,428,217 B1 | 8/2002 | Giltner |
| 6,448,801 B2 | 9/2002 | Dischiano |
| 6,493,148 B1 | 12/2002 | Anikitchev |
| 6,504,858 B2 | 1/2003 | Cheng et al. |
| 6,516,011 B1 | 2/2003 | Treusch |
| 6,559,879 B1 * | 5/2003 | Kobayashi et al. ............ 347/238 |
| 6,594,092 B2 | 7/2003 | von Freyhold et al. |
| 6,600,605 B1 | 7/2003 | Anikitchev |
| 6,643,302 B1 | 11/2003 | Nishikawa et al. |
| 6,736,554 B2 | 5/2004 | Kerboeuf et al. |
| 6,768,593 B1 | 7/2004 | Jutamulia |
| 6,771,686 B1 | 8/2004 | Ullman et al. |
| 6,778,732 B1 | 8/2004 | Fermann |
| 6,804,277 B2 * | 10/2004 | Kimura et al. ................. 372/36 |
| 6,822,978 B2 | 11/2004 | Kafka et al. |
| 6,831,778 B2 | 12/2004 | Yang et al. |
| 6,876,784 B2 | 4/2005 | Nikolov et al. |
| 6,882,664 B2 | 4/2005 | Bolshtyansky et al. |
| 6,888,679 B2 | 5/2005 | Brown |
| 6,891,876 B2 | 5/2005 | Sutter et al. |
| 6,897,486 B2 | 5/2005 | Loh |
| 6,898,231 B2 | 5/2005 | Butterworth |
| 6,919,990 B2 | 7/2005 | Anikitchev et al. |
| 6,922,288 B2 | 7/2005 | Yamanaka et al. |
| 6,922,419 B1 | 7/2005 | Nighan et al. |
| 6,931,037 B2 | 8/2005 | Nighan et al. |
| 6,969,206 B2 | 11/2005 | Iwanaga et al. |
| 6,977,769 B2 | 12/2005 | Matsushita et al. |
| 6,985,648 B2 | 1/2006 | Kish et al. |
| 6,993,059 B2 | 1/2006 | Anikitchev et al. |
| 7,006,194 B2 | 2/2006 | Sumiyoshi et al. |
| 7,006,549 B2 | 2/2006 | Anikitchev et al. |
| 7,010,194 B2 | 3/2006 | Anikitchev et al. |
| 7,027,228 B2 | 4/2006 | Mikhailov |
| 7,065,105 B2 | 6/2006 | Ehlers et al. |
| 7,244,965 B2 | 7/2007 | Andrews et al. |
| 7,259,907 B2 | 8/2007 | Langhans |
| 7,322,754 B2 | 1/2008 | Wolf et al. |
| 7,372,879 B2 | 5/2008 | Giaretta et al. |
| 7,379,237 B1 | 5/2008 | Di Teodoro et al. |
| 7,830,608 B2 | 11/2010 | Hu et al. |
| 7,866,897 B2 | 1/2011 | Hu et al. |
| 2002/0030200 A1 | 3/2002 | Yamaguchi et al. |
| 2002/0037142 A1 | 3/2002 | Rossi |
| 2002/0172475 A1 | 11/2002 | Miyazaki et al. |
| 2003/0044132 A1 | 3/2003 | Nasu et al. |
| 2003/0048987 A1 | 3/2003 | Saito et al. |
| 2003/0161357 A1 | 8/2003 | Bolshtyansky et al. |
| 2004/0095983 A1 | 5/2004 | Whitley |
| 2004/0114860 A1 | 6/2004 | Dultz et al. |
| 2004/0184753 A1 | 9/2004 | Teramura et al. |
| 2004/0213305 A1 | 10/2004 | Nakae et al. |
| 2004/0252744 A1 | 12/2004 | Anikitchev et al. |
| 2004/0258117 A1 | 12/2004 | Nebel et al. |
| 2005/0018743 A1 | 1/2005 | Volodin et al. |
| 2005/0069255 A1 | 3/2005 | Nishimura et al. |
| 2005/0105189 A1 | 5/2005 | Mikhailov |
| 2005/0207454 A1 | 9/2005 | Starodoumov et al. |
| 2005/0248819 A1 | 11/2005 | Hymel et al. |
| 2005/0248820 A1 | 11/2005 | Moser et al. |
| 2005/0257917 A1 | 11/2005 | East et al. |
| 2006/0039418 A1 | 2/2006 | Anikitchev et al. |
| 2006/0045143 A1 | 3/2006 | Anikitchev et al. |
| 2006/0114955 A1 | 6/2006 | Steckman |
| 2006/0126690 A1 | 6/2006 | Kido et al. |
| 2006/0176912 A1 | 8/2006 | Anikitchev |
| 2006/0263004 A1 | 11/2006 | Klimek et al. |
| 2006/0274797 A1 | 12/2006 | Myers et al. |
| 2006/0280209 A1 | 12/2006 | Treusch et al. |
| 2007/0024959 A1 | 2/2007 | Peterson |
| 2007/0263684 A1 | 11/2007 | Nolan |
| 2007/0268571 A1 | 11/2007 | Hu et al. |
| 2007/0268572 A1 | 11/2007 | Hu et al. |
| 2007/0291373 A1 | 12/2007 | Hu et al. |
| 2007/0291813 A1 | 12/2007 | Hu et al. |
| 2008/0008216 A1 | 1/2008 | Miller et al. |
| 2008/0008217 A1 | 1/2008 | Miller et al. |
| 2008/0101429 A1 | 5/2008 | Sipes |
| 2009/0104727 A1 | 4/2009 | Krejci et al. |
| 2009/0115833 A1 * | 5/2009 | Soulliaert et al. ............. 347/238 |
| 2009/0251697 A1 | 10/2009 | Cutillas et al. |
| 2009/0323175 A1 | 12/2009 | Mukai et al. |
| 2010/0177796 A1 | 7/2010 | Miller |
| 2011/0051758 A1 * | 3/2011 | Krejci et al. .................... 372/34 |
| 2012/0177074 A1 | 7/2012 | Liu et al. |

FOREIGN PATENT DOCUMENTS

| | | |
|---|---|---|
| JP | 09-159880 | 6/1997 |
| JP | 411233857 | 8/1999 |
| JP | 2001-83369 | 3/2001 |
| JP | 2001-343561 | 12/2001 |
| JP | 2002-148491 | 5/2002 |
| JP | 2003-131083 | 5/2003 |
| JP | 2003-198051 | 7/2003 |
| JP | 2004-022679 | 1/2004 |
| JP | 2004-096009 | 3/2004 |
| JP | 2005-167041 | 6/2005 |
| JP | 2006-032352 | 2/2006 |
| JP | 2007-149932 | 6/2007 |
| JP | 2007-528509 | 10/2007 |
| JP | 2007-300015 | 11/2007 |
| WO | WO 99/049343 | 3/1999 |
| WO | WO-02/077698 | 10/2002 |
| WO | WO 2007/137005 | 11/2007 |
| WO | WO 2009/037555 | 3/2009 |
| WO | WO 2009/079567 | 7/2009 |
| WO | WO 2009/137703 | 11/2009 |
| WO | WO 2010/081092 | 7/2010 |
| WO | WO 2010/118290 | 10/2010 |
| WO | WO 2011/091170 | 7/2011 |

OTHER PUBLICATIONS

Steinmann et al., "Tunable fs Laser Pulses from OPA with MHz Repetition Rate," Advanced Solid-State Photonics, TuC6, Abstract of Talk, 12:30pm Jan. 31, 2006.

Thestrup et al, High brightness laser source based on polarization coupling of two diode lasers with asymmetric feedback, Applied Physics Letters, 82(5):680-682 (2003).

Tra Fiberoptics, Inc. High-Powered SMA Connectors for Photonic Crystal Fiber. TraTech Fiberoptic, Inc. Brochure; 2004.

Treusch et al., High-Brightness Semiconductor Laser Sources for Materials Processing: Stacking, Beam Shaping, and Bars, IEEE Journal of Selected Topics in Quantum Electronics, 6(4):601-614 (2000).

Valdor Fiber Optics Catalog #910-00001, pp. 1-2 Impact Mount Singlemode Laser Pigtails, Printed from the internet: Dec. 22, 2006.

Volodin et al., Wavelength Stabilization and spectrum narrowing of high-power multimode laser diodes and arrays by use of volume Bragg gratings. Optics Letters 29(16): Aug. 15, 2004.

International Search Report and Written Opinion mailed on Nov. 26, 2007 for International Application No. PCT/US2007/069717 filed on: May 10, 2007 and published as: WO/2007/137005 on: Nov. 29, 2007.

International Search Report and Written Opinion mailed on Jul. 24, 2009 for International Application No. PCT/US2008/087198 filed

(56) References Cited

OTHER PUBLICATIONS on: Dec. 17, 2008 and published as: WO/2009/079567 on: Jun. 25, 2009.
International Search Report and Written Opinion mailed on Dec. 28, 2009 for International Application No. PCT/US2009/043182 filed on: May 7, 2009 and published as: WO/2009/137703 on: Nov. 12, 2009.
International Search Report and Written Opinion mailed on Sep. 30, 2011 for International Application No. PCT/US2011/021931 filed on: Jan. 20, 2011 and published as: WO/2011/091170 on: Jul. 28, 2011.
International Search Report and Written Opinion mailed on Mar. 17, 2010 for International Application No. PCT/US2010/020647 filed on: Jan. 11, 2010 and published as: WO/2010/081092 on: Jul. 15, 2010.
International Search Report and Written Opinion mailed on Jun. 7, 2010 for International Application No. PCT/US2010/030486 filed on: Apr. 9, 2010 and published as: WO/2010/118290 on: Oct. 14, 2010.
Office Action mailed on Feb. 22, 2013 for U.S. Appl. No. 12/337,275, filed Dec. 17, 2008 published as: US 2009/251697 A1 on Oct. 8, 2009.
Office Action mailed on Jul. 17, 2012 for U.S. Appl. No. 12/337,275, filed Dec. 17, 2008 published as: US 2009/251697 A1 on Oct. 8, 2009.
Office Action mailed on Dec. 22, 2011 for U.S. Appl. No. 12/337,275, filed Dec. 17, 2008 published as: US 2009/251697 A1 on Oct. 8, 2009.
Office Action mailed on May 11, 2011 for U.S. Appl. No. 12/337,275, filed Dec. 17, 2008 published as: US 2009/251697 A1 on Oct. 8, 2009.
Office Action mailed on Jun. 14, 2013 for U.S. Appl. No. 12/337,275, filed Dec. 17, 2008 and published as US 2009/0251697 on Oct. 8, 2009.
Supplementary European Search Report completed on Jul. 12, 2013 for EP application No. 09743689.3-1564, and published as EP 2 283 549 on Feb. 16, 2011.
Office Action mailed on May 24, 2013 for U.S. Appl. No. 12/990,215, filed Jan. 12, 2011 and published as US 2011-0103056 on May 5, 2011.

Andersen et al., "High Repetition Rate Tunable Femtosecond Pulses from Fiber Laser Pumped Parametric Amplifier," Advanced Solid-State Photonics, ME2, Abstract of Talk 4:30pm Jan. 30, 2006.
Becht, Vector phase conjuguation for beam combining in a pulsed Nd:YAG laser system, Proceedings of the SPIE—The International Society for Optical Engineering, 3263:11-19 (1998).
Brunner et al., "Powerful red-green-blue laser source pumped with a mode-locked thin disk laser," Optics Letters 29(16):1921-1923, Aug. 15, 2004.
Fuhr, Polarization power summing in laser diode communication systems, SPIE 740:70-76 (1987).
Ghislotti et al., Bidirectional Pumping of Er-Doped Fibers Using Detuned 980-nm Lasers, IEEE Photonics Technology Letters 14(5):780-782 2002.
Headley et al., Tapered Fiber bundles for combining laser pumps., Proceedings of the SPIE—The International Society for Optical Engineering, 5709(1):263-272 2005.
Knitsch et al., Diode Laser Modules of Highest Brilliance for Materials Processing, Proceedings of the SPIE, vol. 4651:256-263 (2002).
Kruglov et al., "Self-similar propagation of parabolic pulses in normal-dispersion fiber amplifiers," JOSA B, 19(3):461-469 2002.
Mecherle, Laser diode combining for free space optical communication, Proceedings of the SPIE—The International Society for Optical Engineering, 616:281-291 (1986).
Miyajima et al., Single Wavelength 5.6 Direct Diode Laser with a High-Efficiency Beam Combination, Jpn. J. Appl. Phys., 43(8):5269-5272 (2004).
Moser et al., "Volume Bragg Grating Devices," Friday Morning Optical Fiber Communications Conference, 2003, OFC 2003 pp. 644-645, vol. 2, Mar. 28, 2003.
Ondax, Inc., "Volume Holographic Gratings (VHG)," 2005 pp. 1-7.
Piper et al., 1.2 mJ, 37 ns single-moded pulses at 10kHz repetition rate from a Q-switched ytterbium fiber Laser, Abstract, In, Proceedings of CLEO/IQEC May 16-21, 2004: Conference on Lasers and Electro-Optics, Quantum Electronics and Laser Science. USA, Institute of Electrical and Electronics Engineers.
Rothenberg, Polarization beam smoothing for ineertial confinement fusion, J. Applied Physics, 87(8):3654-3662 (2000).
Sincerbox, Laser Beam Combining, IBM Technical Disclosure Bulletin, 12(10):1663-1664 (1970).

* cited by examiner

# HIGH RELIABILITY LASER EMITTER MODULES

BACKGROUND

Applications requiring light energy and, in some embodiments, laser energy, may benefit from the use of solid state light sources such as laser diodes which may be included in a laser chip and which are commonly available, reliable to operate and relatively cost effective as a laser energy source. Such devices may include a plurality of laser emitters in a single bar that emit laser light simultaneously in a common direction. Typically the emitters of such solid state emitter bars generate significant amounts of heat during operation and are spaced from each other to allow sufficient cooling without the need for elaborate and expensive cooling systems.

Laser diode bars are often used for communication technology devices, medical applications and other applications such as military applications where it is desirable to couple the output of all the emitters of a single solid state emitter bar or multiple bars in a stacked configuration into a single optical fiber or other optical conduit. Some common optic mounting procedures are not suitable for hermetically sealed assemblies. For example, epoxy adhesive mounting of optical components in a hermetically sealed unit may not be suitable for some embodiments without organic getters because out gassing from the epoxy material may contaminate the system or optics within the system. As such, the heat dissipation and optical alignment requirements of such embodiments may make assembly and packaging of the diode bars difficult, particularly in systems where hermetic sealing of the assembly is required. As such, the heat dissipation and optical alignment requirements of such embodiments may make assembly and packaging of the diode bars difficult, particularly in systems where hermetic sealing of the assembly is required.

What have been needed are laser modules which are configured to provide hermetically sealed enclosures that are thermally stable during use and convenient and cost effective to manufacture.

SUMMARY

Some embodiments of an optical module or subassembly thereof include a laser chip having a low coefficient of thermal expansion (CTE) and a bottom surface. A submount member having high thermal conductivity and a low CTE that substantially matches the low CTE of the laser chip may also have a top surface which is secured to the bottom surface of the laser chip. A CTE matched spacer member which has a CTE that substantially matches the CTE of the submount member, a high thermal conductivity, a bottom surface and a top surface may have the top surface secured to a bottom surface of the submount. A housing base member may have a top surface which is secured to the bottom surface of the CTE matched spacer member. The housing base member may also have a high thermal conductivity, a bottom surface that forms an outer boundary of a bottom portion of the module, a material including a high thermal conductivity and a high CTE. At least one layer of thermally conductive soft adhesive may be disposed between CTE matched elements of this subassembly, such that the soft adhesive is disposed between members and between the housing base and the laser chip. The soft adhesive may also have a hardness which is substantially less than the hardness of the CTE matched elements adjacent the layer of soft adhesive. In this configuration, stresses generated by a CTE mismatch between adjacent members are not transmitted to the laser chip through the thermally conductive soft adhesive between the spacer member and submount. In some cases, the thermally conductive soft adhesive may be disposed between the submount member and CTE matched spacer member. In some instances, a hard adhesive may be used to secure adjacent members with a substantial CTE mismatch.

Some embodiments of an optical module or subassembly thereof may include a laser chip which includes a low CTE and a bottom surface. A submount member which includes high thermal conductivity, a low CTE that substantially matches the low CTE of the laser chip and a top surface may be secured to the bottom surface of the laser chip with a thermally conductive hard solder. A CTE matched spacer member may include high thermal conductivity, a CTE that substantially matches the CTE of the submount member, a bottom surface and a top surface. The top surface of the CTE matched spacer may be secured to a bottom surface of the submount member with a soft solder which has a hardness which is substantially less than a hardness of either the submount member or CTE matched spacer member. A housing base member may include a high thermal conductivity, a bottom surface that forms an outer boundary of a bottom portion of the module. The housing base member may also include a material having a high thermal conductivity, a high CTE and a top surface which is secured to the bottom surface of the CTE matched spacer member. The top surface of the base member may be secured to the bottom surface of the CTE matched spacer member with a thermally conductive hard solder whereby stresses generated by the CTE mismatch between the base and CTE matched spacer member are not transmitted to the laser chip through the soft solder between the spacer member and submount.

Some embodiments of a method of assembling an optical module or subassembly thereof include securing a bottom surface of a laser chip to a top surface of a submount member. The submount member may have a CTE which is substantially the same as the CTE of the laser chip with a hard solder. A bottom surface of CTE matched spacer which includes a CTE that is substantially the same as the laser chip and which has a high thermal conductivity may be secured to a top surface of a module base member with a hard solder. Thereafter, a bottom surface of the submount member may be secured to a top surface of the CTE matched spacer with a soft solder, the soft solder having a yield strength which is substantially less than a yield strength of either the submount or CTE matched spacer member.

Some embodiments of an optical module or subassembly thereof may include a laser chip which has a low CTE and which has a bottom surface. A submount member may include high thermal conductivity, a low CTE that substantially matches the low CTE of the laser chip and a top surface. The top surface may be secured to the bottom surface of the laser chip with a thermally conductive hard solder. A CTE matched spacer member may include high thermal conductivity, a CTE that substantially matches the CTE of the submount member, a bottom surface and a top surface. The top surface of the CTE matched spacer member may be secured to a bottom surface of the submount member with a soft solder which has a hardness that is substantially less than a hardness of either the submount member or CTE matched spacer member. A pedestal member may include a soft alloy material having high thermal conductivity, a CTE substantially higher than the CTE of either the submount member or CTE matched spacer member and a top surface. The top surface of the pedestal member may be secured to the bottom surface of the CTE matched spacer member with a hard solder. A housing base member may include high thermal conductivity, a bottom surface that forms an outer boundary of a bottom portion of the module, a hardened alloy material including a high thermal conductivity and a high CTE and a top surface. The top surface may be secured to the bottom surface of the soft alloy pedestal member with a thermally conductive hard solder. For such a configuration, stresses generated by CTE mismatch between adjacent members of the subassembly are not transmitted to the laser chip through the soft solder layer disposed between the CTE matched spacer member and submount member.

Some embodiments of a method of assembling an optical module or subassembly thereof include securing a bottom surface of a laser chip to a top surface of a submount member that includes a CTE which is substantially the same as the CTE of the laser chip. The bottom surface may be secured to the top surface with a hard solder for some embodiments. A bottom surface of a soft alloy pedestal member which has a high thermal conductivity may be secured to a top surface of a hard alloy module base member with a hard solder or braze. A bottom surface of a CTE matched spacer member may be secured to a top surface of the soft alloy pedestal member with a hard solder. The CTE matched spacer member may include a CTE that is substantially the same as the laser chip and may also include a high thermal conductivity. Thereafter, a bottom surface of the submount member may be secured to a top surface of the CTE matched spacer with a soft solder. In some cases, the soft solder may have a low melt point and low yield strength which is substantially less than a yield strength of either of the adjacent submount or CTE matched spacer member.

Some embodiments of an optical module or subassembly thereof, may include a housing wall member for an optical housing, the wall member including an inside surface, an outside surface and an aperture extending from the inside surface to the outside surface. A conductive pin may pass through the aperture in the housing wall member and be configured to conduct electrical power from a position outside the housing wall member to a position inside the housing wall member. Such a conductive pin may include a ductile material with a high electrical conductivity and a first axial section which has a first nominal outer transverse dimension and which passes through the aperture of the housing wall member. The conductive pin may also include a second axial section which is disposed adjacent to and in electrical communication with the first axial section, which includes a second nominal outer transverse dimension that is substantially greater than the outer transverse dimension of the first axial section, which is disposed outside the housing wall member, and which is configured for low loss coupling of electrical power thereto. For some embodiments, the module may also include an insulative bushing which is secured to the housing wall member, which has an aperture disposed about the first axial section of the conductive pin and which forms a hermetic seal or a portion of a hermetic seal between an outside surface of the first axial section and the wall member. In some cases, the conductive pin has a monolithic structure wherein the first axial section and the second axial section are formed from a single piece of continuous ductile material.

Some embodiments of an optical module or subassembly thereof, may include a housing wall member for an optical housing, the wall member including an inside surface, an outside surface and an aperture extending from the inside surface to the outside surface. The module may also include a conductive pin passing through the aperture in the housing wall member and be configured to conduct electrical power from a position outside the housing wall member to a position inside the housing wall member. An insulative glass bushing may be disposed about and in sealed relation with an outside surface of the conductive pin and in sealed contact with the wall member so as to form a hermetic seal or a portion of a hermetic seal between an outside surface of the conductive pin and the wall member. A ceramic heat dissipation plate which is configured to dissipate heat from an outside surface of the conductive pin may be disposed in secured relation to the conductive pin and housing wall member. The heat dissipation plate may also include high thermal conductivity, and an aperture which is disposed about an outside surface of the conductive pin. In some cases, the module may include at least two conductive pins passing through respective glass bushings and the ceramic heat dissipation plate may include at least two apertures having a size and spacing configured to receive each of the respective at least two conductive pins. In some embodiments, the module may include at least two conductive pins and at least two ceramic heat dissipation plates, the conductive pins passing through respective glass bushings disposed in the housing wall member, the conductive pins also passing through respective apertures of respective ceramic heat dissipation plates.

Some embodiments of an optical module or subassembly thereof, include a housing wall member for an optical housing. The housing wall member may also include an inside surface, an outside surface and at least one aperture extending from the inside surface to the outside surface. A first conductive pin of the module passes through an aperture in the housing wall member and is configured to conduct electrical power from a position outside the housing wall member to a position inside the housing wall member. A first insulative glass bushing may be disposed about and in sealed relation with an outside surface of the first conductive pin. The first insulative glass bushing may also be in sealed contact with the wall member so as to form a hermetic seal or a portion of a hermetic seal between an outside surface of the first conductive pin and the wall member. The module also includes a second conductive pin passing through the aperture in the housing wall member. The second conductive pin may be configured to conduct electrical power from a position outside the housing wall member to a position inside the housing wall member. A second insulative glass bushing may be disposed about and in sealed relation with an outside surface of the second conductive pin and in sealed contact with the wall member so as to form a hermetic seal or a portion of a hermetic seal between an outside surface of the conductive pin and the wall member. A ceramic heat dissipation plate which is configured to dissipate heat from an outside surface of the conductive pins may be disposed in secured relation to the conductive pins and housing wall member. The heat dissipation plate may also include a material having high thermal conductivity. The heat dissipation plate may further include a first aperture which is disposed about an outside surface of the first conductive pin and a second aperture which is disposed about an outside surface of the second conductive pin.

Some embodiments of a method of dissipating heat from a conductive pin of an optical module include emitting heat from a conductive pin which passes through an aperture of a wall member of the optical module housing. Such a conductive pin may also be configured to deliver electrical energy from a position outside the optical module to a position within an interior volume of the optical module. Heat emitted from the conductive pin may be absorbed into a ceramic heat dissipating plate which is disposed in secured relation to the conductive pin an the wall member. The emitted heat may then be dissipated by being transmitted from the ceramic heat dissipating plate to the wall member of the housing and surrounding environment.

Certain embodiments are described further in the following description, examples, claims and drawings. These features of embodiments will become more apparent from the following detailed description when taken in conjunction with the accompanying exemplary drawings.

BRIEF DESCRIPTION OF THE DRAWINGS

The drawings illustrate embodiments of the technology and are not limiting. For clarity and ease of illustration, the drawings may not be made to scale and, in some instances, various aspects may be shown exaggerated or enlarged to facilitate an understanding of particular embodiments.

DETAILED DESCRIPTION

Embodiments discussed herein are directed to methods and devices for packaging emitters such as laser emitter bars or chips having one or more emitters disposed therein. Embodiments discussed herein may also be directed to methods and devices for coupling an output of laser emitter bars to an optical conduit, such as an optical fiber. Such bars or chips may be mounted to or otherwise incorporated into optical system embodiments by a variety of methods. For such optical packages, it may be important that the output array of a chip be properly aligned, that such alignment may be carried out conveniently and accurately and that the final packaging configuration dissipate the heat generated by the chip efficiently. For some embodiments, it may also be important that an enclosure of the optical components be hermetically sealed in order to provide reliability and consistency in the output of the assembly embodiments.

Figure 1:
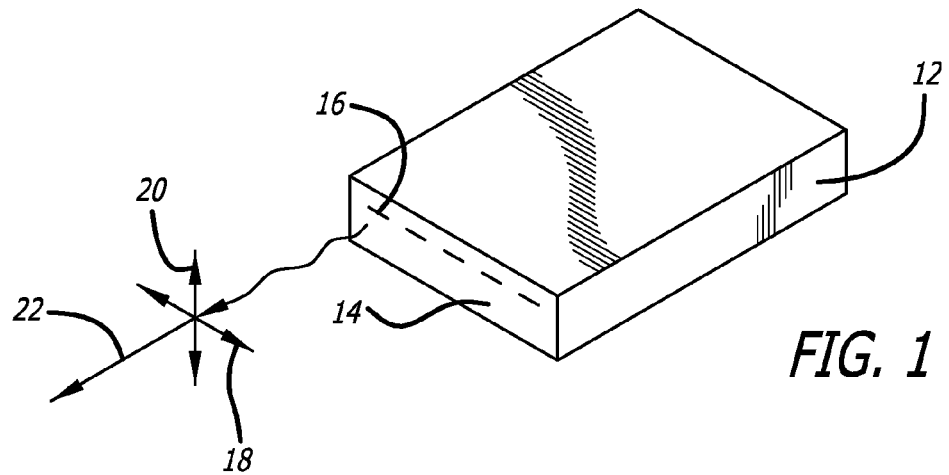
FIG. 1 is a perspective view of a laser chip embodiment.

FIG. 1 shows an embodiment of a laser emitter bar or chip 12 having an output surface 14 that includes a total of 5 emitters 16 which have optical axes that are substantially parallel to each other. The laser emitter bar 12 has an output surface 14 that includes a total of 5 emitters 16 disposed adjacent each other. The emitters 16 are disposed in a substantially linear row along a slow axis direction of the emitters 16, as indicated by arrow 18. A fast axis direction of the emitters 16 is perpendicular to the slow axis direction 18 and is indicated by arrow 20. The emitters 16 are positioned or otherwise configured so as to emit light energy in output beams that propagate along an emission axis 22 which may be perpendicular to both the slow axis direction 18 and fast axis direction 20.

Laser emitter bar embodiments 12 may have any suitable number of emitters 16, such as about 1 emitter to about 100 emitters, more specifically, about 3 emitters to about 12 emitters. For some embodiments, each laser emitter bar 12 having about 5 emitters 16 may have an output power of about 5 W to about 50 W, more specifically, about 10 W to about 20 W. Emitters 16 may include laser diodes such as edge emitting laser diodes, vertical cavity surface emitting lasers (VCSELs) and the like. Materials for the emitters 16 of the laser emitter bar 12 may include semiconductor materials such as GaAs, InP or any other suitable laser gain medium.

Generally, the emitting aperture of a laser diode embodiment of an emitter 16 is rectangular in shape with the long dimension of the emitter 16 having a size of typically tens or hundreds of microns, while the short dimension is typically one to several microns in size. Radiation emerging from an emitter 16 diverges with the divergence angle being greater along the short emitter 16 direction. Divergence angles are lower in the direction of the long emitter 16 direction. Some embodiments of the emitters 16 may have a physical width of about 50 microns to about 300 microns, a height of about 1 micron to about 3 microns, and a cavity length of about 0.5 mm to about 5 mm. Such emitter 16 embodiments may have a divergence of light energy output of about 2 degrees to about 12 degrees in the slow axis direction 18 and a divergence of light energy output of about 30 degrees to about 75 degrees in the fast axis direction 20.

Some embodiments of the laser diode bars 12 may have emitters 16 that emit light energy having a wavelength of about 700 nm to about 1500 nm, more specifically, about 800 nm to about 1000 nm. Emitters 16 may emit light having a centroid or peak wavelength of about 300 nm to about 2000 nm, more specifically, of about 600 nm to about 1000 nm, including wavelengths across the near infrared spectrum. Some particular embodiments of useful emitters may emit light at a peak wavelength of about 350 nm to about 550 nm, 600 nm to about 1350 nm or about 1450 nm to about 2000 nm. Such laser diode bars may be operated in either a pulsed mode or continuous wave mode.

Frequently, the output spectral band of individual emitters 16 which are not wavelength controlled (for example wavelength controlled by providing wavelength-dependent feedback from a volume index grating or the like) may be about 0.5 nm to about 2.0 nm or more. Due to the variation in peak emission wavelength in addition to the spectral band for each individual emitter, the overall bandwidth of the laser emitter bar 12 may be about 2 nm to about 5 nm, for some embodiments.

Figure 2:
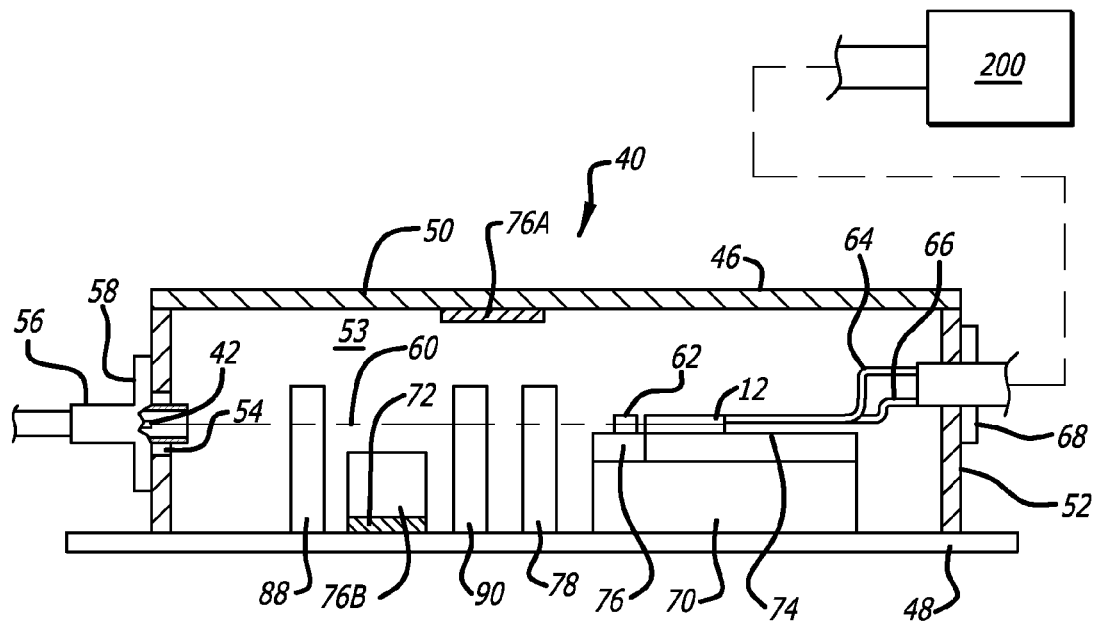
FIG. 2 is an elevation view of a laser module embodiment in partial section.

FIG. 2 illustrates an embodiment of an optical apparatus assembly 40 in the form of a laser emitter module for coupling the output of a laser emitter bar 12 into an input surface 42 of an optical fiber 44. The assembly 40 includes a hermetically sealed enclosure in the form of a housing 46 having a base 48, a lid 50, and side walls 52 which are disposed between the base 48 and the lid 50. An aperture 54 is disposed in a wall 52 opposite the laser emitter bar 12 and is configured to accept an adjustable ferrule assembly 56 having a radially extending flange 58 which may be sealingly secured to a wall of the enclosure 46. Although laser emitter bar 12 is shown with 5 emitters 16, the module 40 may include a laser emitter bar 12 having any suitable number of emitters 16 as discussed above.

The housing 46 also includes one or more apertures disposed on a wall opposite the aperture 54 that is configured to accommodate a plurality of high current electrical conductors. For the embodiment shown, a first electrical conductor 64 and second electrical conductor 66 are used to provide electrical power to the interior of the housing 46 for powering the laser emitter bar or bars 12 disposed within the housing 46. The conductors 64 and 66 may include solid conducting material or be configured as a multifilament braid or strand for flexibility. The conductors 64 and 66 may be made from materials having high degree of electrical conductivity such as copper, silver, gold or the like. Portions of the conductors 64 and 66 are secured in a fixed and sealed relation to a flange member 58 that may in turn be secured in a fixed and sealed relation to a wall 52 of the housing 46. The seal between the conductors 64 and 66 and the flange 58 and the flange 58 and the housing 46 may be a hermetic seal for some embodiments.

A heat sink spacer 70 may be secured to an inside surface 72 of the base 48 with a bonding agent layer (not shown, but may be similar is some cases to the solder layers shown in FIGS. 5C and 5D discussed below) disposed between the heat sink spacer 70 and base 48. The heat sink spacer embodiment 70 shown is substantially rectangular having an upper surface which is substantially parallel to a lower surface thereof. The heatsink 74 may be used as a platform to mount the laser emitter bar 12 of the module 40. For some embodiments, the laser emitter bar 12 may be secured to the heatsink 74 with thermally conductive adhesive bonding, thermal compression bonding, soft solder, hard solder, including gold tin solder or the like.

In some cases, the bonding agent layer between the heat sink spacer 70 and the base 48, which may be a thin substantially uniform layer covering the entire bottom surface of the heat sink spacer 70, may include hard solder, soft solder, thermally conductive adhesive such as silver epoxy or silver glass, welding, glass attaching or the like. Suitable solders for the bonding agent layer between the heat sink spacer 70 and the base 48 may include InSn, SnAg, AuGe and AuSn solders as well as others. For some hard solder embodiments such as AuSn, the Au concentration may be about 80 percent to about 86 percent relative to the Sn concentration.

For some embodiments of apparatus 40, such as hermetically sealed embodiments thereof, it may be desirable to include organic getters within the housing when bonding agents that may produce outgassing, such as epoxies, are used. FIG. 2 shows an organic getter assembly 76A secured to the inside surface of the cover 46 and an organic getter assembly 76B clipped to the base 48. Such getter assemblies 76A and 76B may be included in any of the module embodiments discussed herein. The organic getter assemblies 76A and 76B may be configured to absorb organic outgassing that occurs within the interior volume 53 of the module 40. Such organic getter assemblies may be included within any of the module assembly embodiments discussed herein.

For the embodiment shown as well as other embodiments, the fast axis collimator 62 may be secured in a fixed position adjacent an output surface 14 of the laser emitter bar 12. The fast axis collimator 62, which may include an elongate cylindrical lens, may be configured to substantially collimate the output of the laser emitter bar 12 in a fast axis direction. For some embodiments, the fast axis collimator 62 may be secured to the optical substrate 76 by soldering, welding or glass attaching. For some embodiments, the fast axis collimator 62 may be secured to the optical substrate 76 by epoxy bonding. The assembly 40 may also include a variety of additional elements disposed within the optical path of the output beam of the laser chip 12 including a slow axis collimator 78, focusing element 88 as well as additional optional optical components or elements 90 that may include lenses, filters, prisms, polarizers, waveplates such as ¼ waveplates and ½ waveplates and the like.

In some cases, the packages for high power diode laser modules may need to be designed to be capable of dissipating a few watts, tens watts, hundreds watts or even higher heat power with limited package sizes. Dissipation of heat from such power levels may require that a package base of an optical module be made of materials having high thermal conductivity, such as copper and aluminum, as well as other similar materials or their alloys. Many of these materials having high thermal conductivity also have a coefficient of thermal expansion which is high relative to semiconductor materials, for example in the range of about 16 parts per million per degree Centigrade (ppm/C) to about 20 ppm/C. Material embodiments having a high thermal conductivity as discussed herein may have a thermal conductivity of at least about 150 Watts per meter-degree Kelvin (W/m·K). Some materials having high thermal conductivity as discussed herein may have a thermal conductivity of about 150 W/m·K to about 400 W/m·K.

Furthermore, diode laser modules, particularly for pulsed applications, high reliability applications, or both, may require a laser chip or laser bar 12 of the module to be bonded or otherwise secured to an adjacent heatsink with a hard solder such as AuSn solder or the like. The hard solder may provide the mechanical strength suitable for high reliability applications. In many cases, the laser chip 12 may be so secured to a heatsink that has a CTE that substantially matches the CTE of the laser chip 12 itself. For example, some high energy laser chips 12 may be made primarily from GaAs semiconductor material which may have a CTE of about 6 ppm/C to about 7 ppm/C. Such a chip 12 may be secured to a heatsink submount or carrier 100 made of a material such as copper tungsten (CuW), or metalized aluminum nitride (AlN) or beryllium oxide (BeO). These submount material may also have a CTE in a range of about 4 ppm/C to about 7 ppm/C and thus substantially match the CTE of the laser chip 12 itself. Such submount materials may also have a high thermal conductivity in order to not only substantially match the CTE of the laser chip but also effectively dissipate heat from the laser chip 12.

Substantially matching the CTE of a laser chip to the CTE of a heat sink submount which is secured to and in thermal communication with the laser chip may be useful to prevent or minimize thermal stress between these two elements during operation of the device including distortion or thermally induced warping that might otherwise be caused by disparate CTEs of the laser chip and submount secured thereto. In some cases, a base component of a high energy optical module may require a flatness to be maintained during operation of no more than 50 microns per 25 mm deviation. In addition, stress induced by a CTE mismatch between a base member and heatsink, or any other two adjacent components of an optical module, may cause such a bond therebetween to be compromised.

Figure 3:
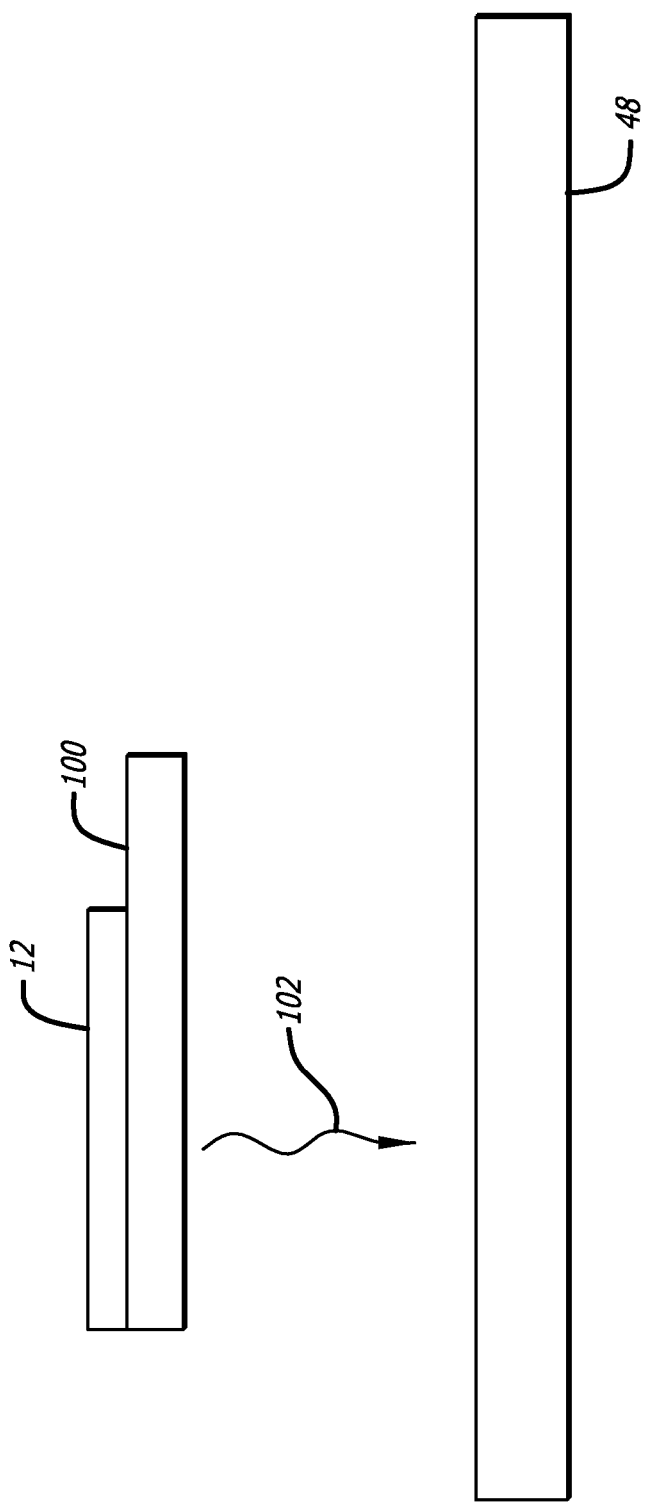
FIG. 3 is a schematic representation of thermal energy transfer from a laser chip embodiment to a thermally conductive base member embodiment.

Managing the transmission of heat 102 from laser chip 12 and submount 100 to base 48 of an optical module 40, as shown in FIG. 3, may be a challenge. As discussed, this may be particularly true in cases where the heat 102 to be dissipated must be conducted through a variety of materials having differing CTEs. For example, in some cases, the heat to be dissipated which is emitted from the laser chip 12 must pass through a transition from the CTE of the high power diode laser chip/bar 12, which may have a CTE of about 6~7 ppm/C, to the CTE of the material of the base 48 which may include a highly thermally conducting metal, such as copper or aluminum, which may have CTEs of about 16~20 ppm/C.

Figure 4:
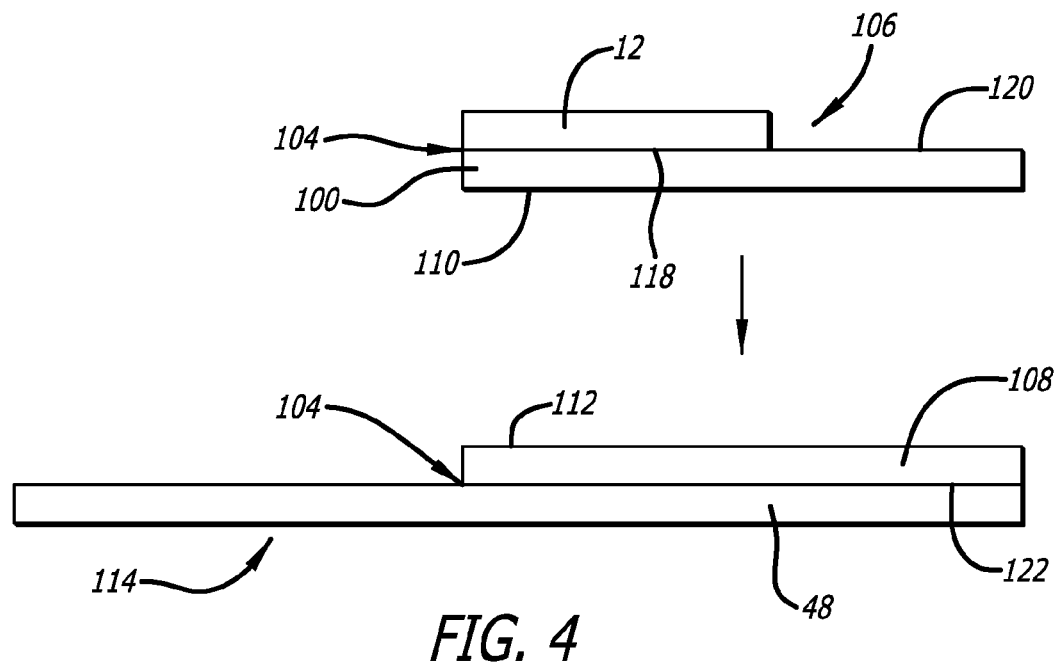
FIG. 4 is a schematic representation of an assembly method embodiment of a laser module subassembly embodiment.

In some embodiments configured to address these issues, a laser chip 12 (which may also be known as a laser bar or minibar) may have a CTE of about 6~7 ppm/K (if it is made of GaAs semiconductor), may be bonded to a CTE matched heatsink or submount 100 that has a high thermal conductivity and a CTE that is substantially similar to that of the GaAs chip 12 as shown in FIG. 4. In some cases, such submounts 100 may include CuW, metalized AlN or BeO, which may have CTEs in the range of about 4 ppm/C to about 7 ppm/C. The laser chip 12 may be secured to such a submount 100 with a hard solder 104 (such as AuSn or any other suitable hard solder discussed herein) to produce a joint between the laser chip 12 and submount 100 with high mechanical strength and reliability for highly reliable diode laser modules. The laser chip 12/submount 100 sub-assembly 106 may also be referred to by the abbreviations CoS, CoS, or BoS. The bonding reliability between laser chip 12 and heatsink/submount 100 is high as they are substantially CTE matched and the tensile stress of hard solder is high. For example, the tensile or yield strength of some hard solders 104 such as AuSn may be about 170 mega Pascals (MPa) to about 300 MPa, more specifically, about 200 MPa to about 220 MPa in some cases, and even more specifically, about 210 MPa. The hard solder 104 may form a layer between the bottom surface at the chip 12 and a top surface of the submount 100. The hard solder layer may be a thin layer of solder material as shown in FIG. 5C. The thin layer of soft solder 116 is also shown disposed between a bottom surface 110 of the submount 100 and a top surface 112 of the CTE matched spacer 108, in FIG. 5D. The solder or adhesive layers for embodiments discussed herein may have a thickness of up to about 100 microns, more specifically, up to about 40 microns, and even more specifically, up to about 10 microns, in some cases. The solder layers of embodiments discussed herein may be applied by a variety of suitable methods. In one exemplary method, a solder material may be pre-coated onto one or more of the surfaces to be bonded. Such pre-coating may be carried out by sputter coating, vapor deposition or the like. In other methods, a pre-form layer or foil made from the preselected solder material may be placed between the two surfaces to be secured together by the soldering process. In some other cases, a solder layer may be drawn between the respective surfaces by capillary action during a soldering process. Such processes, features and dimensions of the solder bonds may be applicable to any other suitable solder bond discussed herein.

In order to facilitate the transition from the CTE of the laser chip 12/submount 100 to the base 48, a CTE matched spacer 108 may be bonded to the high thermal conducting metal base 48, also as shown in FIG. 4. Such a base 48 having high thermal conductivity may be made from or include metals such as copper, aluminum, or the like as well as their alloys. The CTE matched spacer 108 may be secured or otherwise bonded to the base 48 with a hard solder such as AuSn solder, AuGe solder, AuSi solder or the like for high reliability and good thermal performance. In some cases, the hard solder 104 may form a layer between a top surface of the base 48 and a bottom surface of the CTE matched spacer 108 and adhere to each of these surfaces by wetting action or other type of bond. The material of the CTE matched spacer 108 may be selected to have good thermal conductivity and a CTE which substantially matches the CTE of the laser chip 12 and submount 100. This subassembly 106 may be referred to as the base-spacer sub-assembly in some cases. The CTE matched spacer 108 may also be made from similar materials as those of the submount 100. In some instances, the CTE matched spacer may be made from CuW, AlN, BeO, CuMo, laminated material such as CuMoCu or the like or metal matrix composite material such as Cu/SiC or the like. In such embodiments, the bonding reliability between base 48 and CTE matched spacer 108 is high as the tensile stress of hard solder used for the bond maybe high, for example about 170 MPa to about 300 MPa in some cases, more specifically, about 200 MPa to about 220 MPa, and even more specifically, about 210 MPa if AuSn solder is used.

Figure 5:
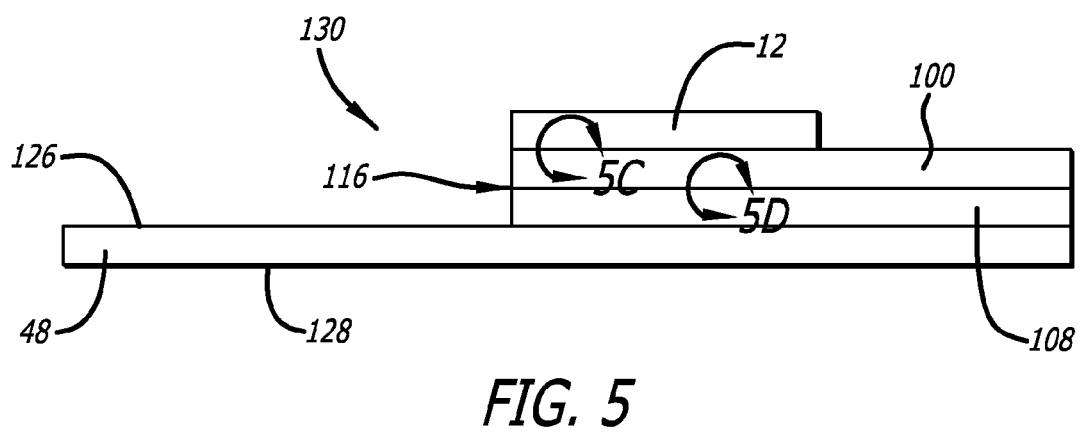
FIG. 5 is an elevation view of an embodiment of a laser module subassembly.

Once the laser chip 12 is secured to the submount 100 and the CTE matched spacer 108 is secured to the base 48, a bottom surface 110 of the submount 100 may then be bonded or otherwise secured to a top surface 112 of the CTE matched spacer 108 as shown in FIG. 5. This bond may be carried out in some cases with a layer of soft solder 116, like lead free solders or other low melting point solders. For such a configuration, stress created in base-CTE matched spacer sub-assembly 114 may not substantially transfer to a bonding region of the laser chip 12 between the top surface of the submount 100 and bottom surface of the chip 12 because the tensile stress or strength of soft solder 116 (which may be about 2 MPa to about 50 MPa in some cases) may be much lower than the tensile or yield strength of the material of the submount 100, which may be about 150 MPa to about 350 MPa for the materials discussed above for this component. In addition, the elastic modulus of the soft solder 116 may be much lower than the elastic modulus of the material of the submount 100. In some cases, the elastic modulus of the soft solder 116 may be about 10 GPa to about 30 GPa for the soft solder embodiments discussed, about 20 GPa to about 30 GPa in some cases, and the elastic modulus of the submount material may be about 300 GPa to about 400 GPa for the submount materials discussed above. The bonding reliability between submount 100 and CTE matched spacer with soft solder 116 may still be high as their CTE mismatch is minimized by this configuration with minimal thermally induced stress or strain.

In some cases, the optical module subassembly shown in FIGS. 4 and 5 may include a laser chip 12 having a low CTE and a bottom surface 118. A submount member 100 having high thermal conductivity and a low CTE that substantially matches the low CTE of the laser chip 12 may also have a top surface 120 which is secured to the bottom surface 118 of the laser chip 12. A CTE matched spacer member 108 which has a CTE that substantially matches the CTE of the submount member 100, a high thermal conductivity, a bottom surface 122 and a top surface 112 may have the top surface 112 secured to a bottom surface 110 of the submount 100. A housing base member 48 may have a top surface 126 which is secured to the bottom surface 122 of the CTE matched spacer member 108. The housing base member 48 may also have a high thermal conductivity, a bottom surface 128 that forms an outer boundary of a bottom portion of the module 130, a material including a high thermal conductivity and a high CTE. At least one layer of thermally conductive soft adhesive, such as soft solder 116, may be disposed between CTE matched elements of this subassembly, such that the soft adhesive is disposed between members and between the housing base 48 and the laser chip 12. The soft adhesive may also have a hardness which is substantially less than the hardness of the CTE matched elements adjacent the layer of soft adhesive such as the CTE matched spacer 108 and submount 100. In this configuration, stresses generated by a CTE mismatch between adjacent members are not transmitted to the laser chip 12 through the thermally conductive soft adhesive between the CTE matched spacer member 108 and submount 100. In some cases, the thermally conductive soft adhesive may be disposed between the submount member 100 and CTE matched spacer member 108. In some instances, a hard adhesive, such as hard solder 104, may be used to secure adjacent members with a substantial CTE mismatch. The optical module subassembly 130 of FIGS. 4 and 5 may also include any or all of the features, dimensions or materials of the optical module 40 shown in FIG. 2. In addition, any of the features, dimensions or materials of the subassembly shown in FIGS. 4 and 5 may be incorporated into the module embodiment 40 shown in FIG. 2.

For some embodiments, the thermally conductive soft adhesive may be disposed between the submount member 100 and CTE matched spacer member 108. Some soft adhesive embodiments may form a bond to adjacent surfaces due to wetting action. In some instances, the thermally conductive soft adhesive may include the soft solder 116 such as a lead free solder, an indium-based solder or the like, and have a yield strength of about 2 MPa to about 50 MPa. In some embodiments, a hard adhesive may have a tensile strength of about 170 MPa to about 300 MPa and be used to secure adjacent members of the module which have a substantial CTE mismatch relative to each other. Such a hard adhesive may include a hard solder 104 such as AuSn solder, AuGe solder, AuSi solder or the like.

Some embodiments of an optical module or subassembly thereof as shown in FIGS. 4 and 5 may include a laser chip 12 which includes a low CTE and a bottom surface 118. A submount member 100 which includes high thermal conductivity, a low CTE that substantially matches the low CTE of the laser chip 12 and a top surface 120 may be secured to the bottom surface 118 of the laser chip with a thermally conductive hard solder 104. A CTE matched spacer member 108 may include high thermal conductivity, a CTE that substantially matches the CTE of the submount member, a bottom surface 122 and a top surface 112. The top surface 112 of the CTE matched spacer 108 may be secured to a bottom surface 110 of the submount member 100 with a soft solder 116 which may have a hardness which is substantially less than a hardness of either the submount member 100 or CTE matched spacer member 108. A housing base member 48 may include a high thermal conductivity, a bottom surface 128 that forms an outer boundary of a bottom portion of the module. The housing base member 48 may also include a material having a high thermal conductivity, a high CTE and a top surface 126 which is secured to the bottom surface 122 of the CTE matched spacer member 108. The top surface 126 of the base member 48 may be secured to the bottom surface 122 of the CTE matched spacer member 108 with a thermally conductive hard solder 104 whereby stresses generated by the CTE mismatch between the base and CTE matched spacer member 108 are not transmitted to the laser chip 12 through the soft solder 116 between the CTE matched spacer member 108 and submount 100.

For some such optical module embodiments, the soft adhesive in the form of soft solder 116 may include a solder selected from the group consisting of a lead free solder such as SnAg, SnAgCu or the like, an indium-based solder such as indium, indium alloy or the like and have a tensile strength of about 2 MPa to about 50 MPa. In some cases the hard adhesive in the form of hard solder 104 may include a solder selected from the group consisting of AuSn solder, AuGe solder, AuSi solder or the like and have a tensile strength of about 170 MPa to about 300 MPa, more specifically, about 200 MPa to about 220 MPa. For some embodiments, the submount 100 may include a CTE of about 4 ppm/C to about 7 ppm/C and the CTE matched spacer 108 may include a CTE of about 4 ppm/C to about 10 ppm/C. The base member 48 may have a CTE of about 16 ppm/C to about 20 ppm/C in some instances. Suitable materials for the CTE matched spacer 108 may include a material selected from the group consisting of CuW, AlN, BeO, CuMo, laminated material, metal matrix composite material and the like. In general, such a module may include a laser chip 12 that includes a high energy laser chip 12, such as a pulsed high energy laser chip 12 that may have an power output of about 1 Watt to about 100 Watts or higher.

Figure 5A:
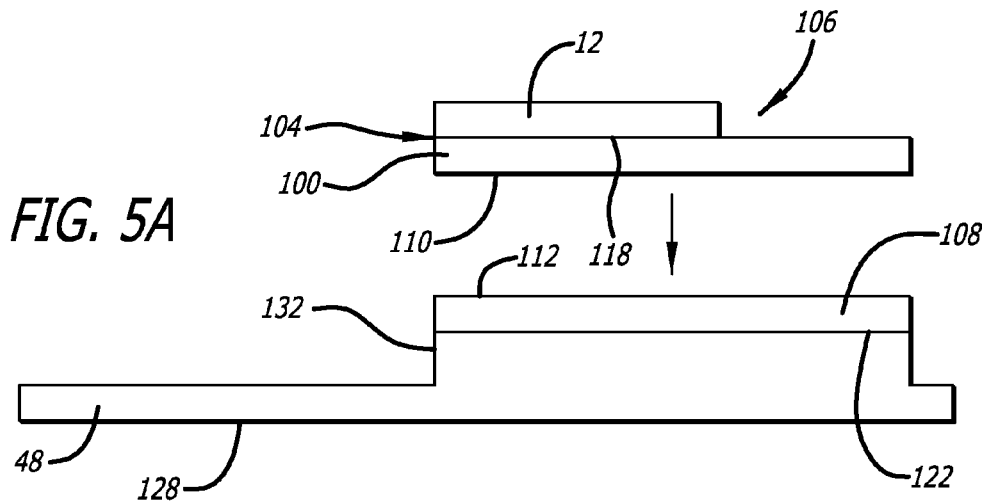
FIGS. 5A and 5B illustrate an embodiment of the laser module subassembly of FIG. 5 including an integral pedestal on the base member.
Figure 5B:
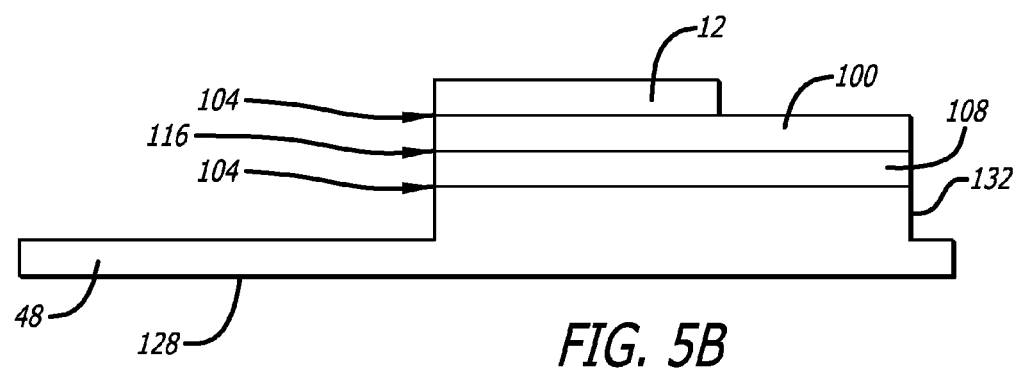
Figure 5C:
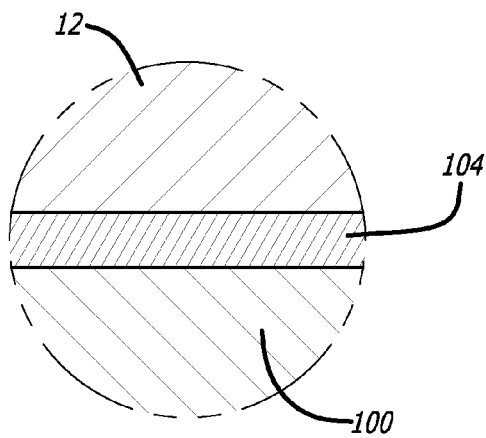
FIG. 5C is an enlarged view in section showing the hard solder joint between the laser chip and submount of the corresponding encircled portion of FIG. 5.
Figure 5D:
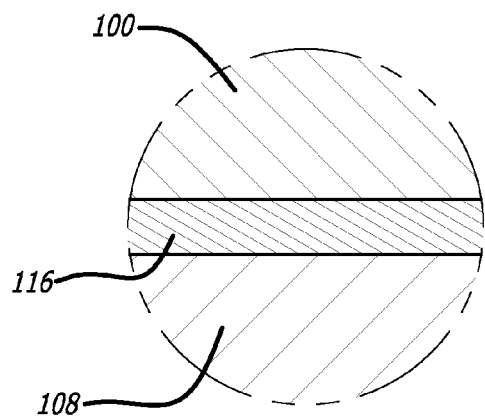
FIG. 5D is an enlarged view in section showing the soft solder joint between the submount and CTE matched spacer of the corresponding encircled portion of FIG. 5.

Referring to FIGS. 5A and 5B, a laser module sub-assembly is shown having a housing base member 48 that includes an integral pedestal 132. The integral pedestal may be formed integrally as an extension of the base 48 made from the same monolithic piece of thermally conductive material as the base member. The pedestal 132 shown in the FIGS. 5A and 5B may have the same or similar features, dimensions or materials as those of the pedestal of the embodiment shown in FIGS. 6 and 7.

Figure 6:
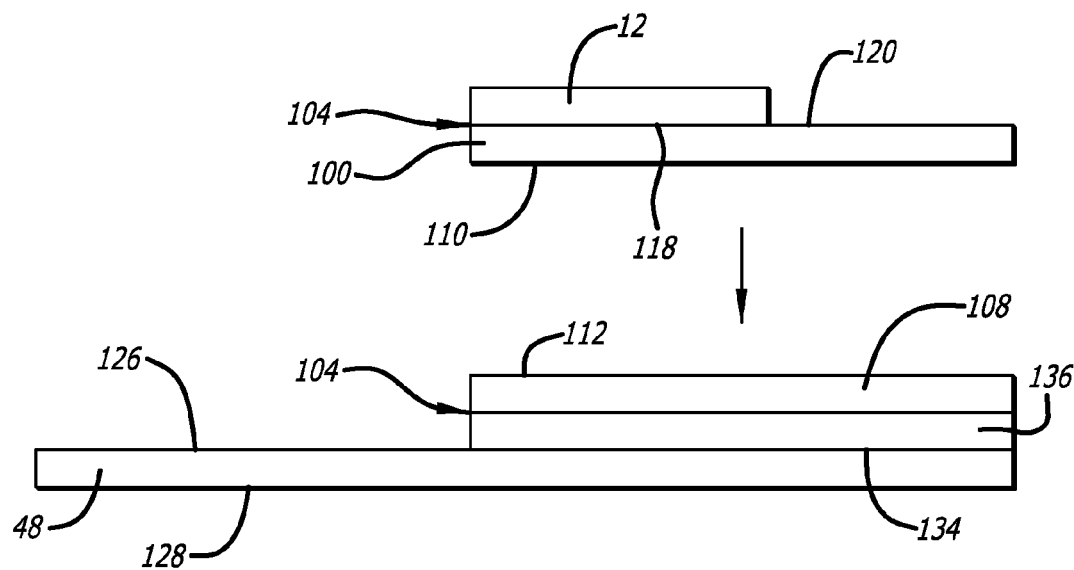
FIG. 6 is a schematic representation of an assembly method embodiment of a laser module subassembly embodiment.

Some other embodiments of optical modules or subassemblies thereof may include additional layers or members configured to dissipate heat generated from the laser chip 12 and maintain mechanical and thermal stability of the module. Referring to FIG. 6, a laser chip 12 has a bottom surface 118 which is bonded to a top surface 120 of a submount 100. In some cases, the laser chip 12 may be made of GaAs semiconductor having a CTE of about 6 ppm/C to about 7 ppm/C. The submount 100 may be made from a material such as CuW, metalized AlN, BeO or the like, having a low CTE that substantially matches the CTE of the laser chip 12. These particular materials may have a CTE of about 4 ppm/C to about 7 ppm/C. The bottom surface 118 of the laser chip 12 and top surface 120 of the submount 100 may be bonded or otherwise secured by a layer of hard adhesive disposed between these members. Suitable hard adhesives such as hard solders 104 may be configured to generate a bond between the adjacent surfaces by wetting action. Such adjacent surfaces may be disposed in close proximity with enough space therebetween for a thin layer of solder material. In some cases hard solders such as AuSn, AuGe or AuSi may be used, particularly for applications where high reliability is desired for the diode laser module embodiment. The bonding reliability between the surfaces of the laser chip 12 and submount 100 is high as the CTE for each of these elements is substantially matched and the tensile stress of hard solder is high. In some cases, the tensile strength of such hard solders 104 may be about 170

MPa to about 300 MPa, more specifically, about 200 MPa to about 220 MPa, and even more specifically, about 210 MPa if AuSn solder is used. In some cases, the wall member of the housing of an optical module may include apertures for passage of conductive pins and the like. Such an aperture may be sealed to such a conductive pin with one or more bushings or collars that may be made from a variety of suitable materials with controlled thermal expansion, such as iron-nickel-cobalt alloys such as Kovar®, or ceramic materials such as alumina or the like.

For some embodiments, the laser chip 12 may have dimensions as discussed above, including a length of about 0.5 mm to about 5 mm, a width of about 0.4 mm to about 12 mm, and a height of about 0.075 mm to about 0.15 mm. In some cases, the submount 100 may have dimensions that are similar to those of the submount 100 or perhaps slightly larger in order to provide a suitable platform upon which to secure the laser chip 12. In some embodiments, the submount 100 may have a length of about 2 mm to about 10 mm, a width of about 2 mm to about 20 mm, and a height of about 0.3 mm to about 1.5 mm.

Figure 7:
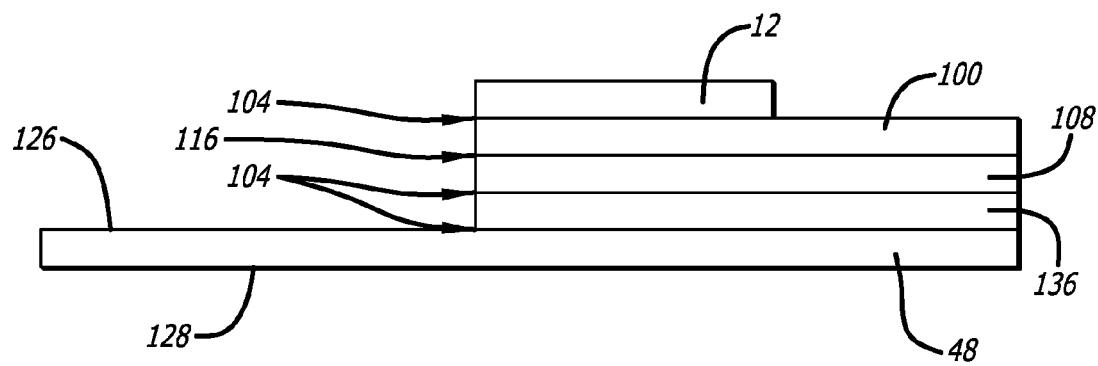
FIG. 7 is an elevation view of an embodiment of a laser module subassembly.

In some embodiments, the base 48 of the module subassembly embodiment may be made from a hard copper alloy, such as a metal matrix composite, zirconium copper or the like. Such an embodiment is shown in FIGS. 6 and 7. An example of a metal matrix composite suitable for some module embodiments includes Glidcop® manufactured by SCM Metal Products, Inc. Such materials may be used as the package base 48 to get both high thermal performance and high mechanical strength. The top surface 126 of such a base 48 may be secured to a bottom surface 134 of an annealed soft copper pedestal 136. The pedestal 136 may be secured to the base member 48 with a hard adhesive such as a hard solder 104 or braze. Suitable hard solders 104 may include AuSn, AuGe, AuSi or the like. Suitable materials for the pedestal 136 include relatively soft, ductile materials having a high level of thermal conductivity such as oxygen free high thermal conductivity (OFHC) copper. Materials such as OFHC copper used for the pedestal 136 may have a hardness of about 40 to about 60 Vickers for some embodiments. The bonding reliability between hard copper base 48 and soft copper pedestal 136 may be as high as the CTE of these two elements 48 and 136 is substantially matched and tensile stress of the hard adhesive such as the hard solder embodiments 104 may be high, such as the tensile values discussed above, including, more specifically, about 210 MPa in some cases. Glidcop copper, which may include a copper that is doped with about 0.3 percent alumina, may have CTE of about 16 ppm/C to about 18 ppm/C at room temperature, yield strength of about 255 MPa to about 300 MPa and a modulus of about $1.28 \times 10^{11}$ Pa. In some cases, OFHC annealed copper may have a yield strength of about 30 MPa to about 35 MPa. For such material embodiment embodiments, the soft copper pedestal 136 may help absorb the strain and stress caused by a CTE mis-match between hard copper alloy base 48 and CTE matched spacer 108 which will be discussed below.

A CTE matched spacer 108 made from a material having a CTE that substantially matches the CTE of the submount 100 may be secured to a top surface 138 of the pedestal 136 by a layer of adhesive, such as a hard adhesive. In some cases, the CTE of the CTE matched spacer 108 may have a CTE substantially matching the CTE of a material such as GaAs, which is used for some laser chip embodiments 12 as discussed above. The CTE matched spacer 108 may be made from materials which are the same as or similar to those materials of the submount, including CuW, metalized AlN, BeO, CuMo or the like. The hard adhesive used for bonding the CTE matched spacer to the pedestal may include a hard solder 104 such as AuSn solder or the like, in some cases, for high reliability and high thermal performance. The sub-assembly of base member 48, pedestal member 136 and CTE matched spacer 108 may sometimes be referred to as the base-spacer sub-assembly. The bonding reliability between the soft copper pedestal 136 and the CTE matched spacer 108 may be high as the tensile stress or strength of the hard adhesive or hard solder 104 is high. In some cases, the tensile strength of the hard adhesive or solder 104 may be about 170 MPa to about 300 MPa, more specifically, about 200 MPa to about 220 MPa, and even more specifically, about 210 MPa if AuSn solder is used. In such configurations, the tensile strength of the hard solder 104 may be sufficient to maintain a secure bond even with the mechanical stresses caused by the CTE mismatch of the CTE matched spacer 108 and pedestal 136 during temperature variations in use. Once the base-spacer sub-assembly is complete, a bottom surface 110 of the submount 100 may be secured to a top surface 112 of the CTE matched spacer 108 with a soft adhesive, such as a soft solder 116, as shown in FIG. 7. In some case, soft solders 116 such as lead free solders or other low melting point solders may be used. More particularly, soft solders 116 having formulations such as lead free solders or indium-based solders may be used in some cases.

For optical module sub-assembly configurations such as shown in FIGS. 6 and 7, the stress created in base-spacer sub-assembly generally will not transfer to laser chip bonding region at the bottom of laser chip 12 as the tensile stress of soft solder 116 (about 2 MPa to about 50 MPa for some soft solder embodiments) is much lower than the tensile strength of the material of the submount 100 (about 150 MPa to about 350 MPa for some submount embodiments). Also, the elastic modulus of the soft solder 116 is much lower than that of the submount 100 material (10 GPa to about 30 GPa for soft solder embodiments vs. 300 GPa to about 400 GPa for certain submount materials). Furthermore, the bonding reliability between chip submount 100 and CTE matched spacer 108 is high as the CTE mismatch of the respective materials of the two elements is minimized.

For some embodiments, the CTE matched spacer 108 may have dimensions including a length of about 2 mm to about 20 mm, a width of about 2 mm to about 20 mm, and a height of about 0.3 mm to about 3 mm. In general, it may be desirable for the CTE matched spacer 108 to have a top surface 112 with dimensions which are similar to or larger than the dimensions of the submount 100 in order to provide a suitable platform upon which to secure the submount 100. In some cases, the pedestal 136 may have dimensions that are similar to those of the CTE matched spacer 108 or perhaps slightly larger in order to provide a suitable platform upon which to secure the CTE matched spacer 108. In some embodiments, the pedestal 136 may have a length of about 2 mm to about 25 mm, a width of about 2 mm to about 25 mm, and a height of about 0.3 mm to about 5 mm. In some cases, the base member 48 may have a length of about 10 mm to about 100 mm, a width of about 10 mm to about 100 mm, and a height of about 1 mm to about 10 mm.

Some embodiments or examples of an optical module or subassembly thereof as shown in FIGS. 6 and 7, may include a laser chip 12 which has a low CTE and which has a bottom surface 118. A submount member 100 may include high thermal conductivity, a low CTE that substantially matches the low CTE of the laser chip and a top surface 120. The top surface 120 may be secured to the bottom surface 118 of the laser chip with a thermally conductive hard solder 104. A CTE matched spacer member 108 may include high thermal conductivity, a CTE that substantially matches the CTE of the submount member, a bottom surface 122 and a top surface 112. The top surface 112 of the CTE matched spacer member may be secured to a bottom surface 110 of the submount member 100 with a soft solder 116 which may have a hardness that is substantially less than a hardness of either the submount member 100 or CTE matched spacer member 108. A pedestal member 136 may include a soft alloy material having high thermal conductivity, a CTE substantially higher than the CTE of either the submount member 100 or CTE matched spacer member 108 and a top surface 138. The top surface 138 of the pedestal member 136 may be secured to the bottom surface 122 of the CTE matched spacer member 108 with a hard solder 104. A housing base member 48 may include high thermal conductivity, a bottom surface 128 that forms an outer boundary of a bottom portion of the module, a hardened alloy material including a high thermal conductivity and a high CTE and a top surface 126. The top surface 126 may be secured to the bottom surface 134 of the soft alloy pedestal member 136 with a thermally conductive hard solder 104. For such a configuration, stresses generated by CTE mismatch between adjacent members of the subassembly may not be transmitted or substantially transmitted to the laser chip 12 through the soft solder layer 116 disposed between the CTE matched spacer member 108 and submount member 100. The optical module subassembly of FIGS. 6 and 7 may also include any or all of the features, dimensions or materials of the optical module 40 shown in FIG. 2. In addition, any of the features, dimensions or materials of the subassembly shown in FIGS. 6 and 7 may be incorporated into the module embodiment 40 shown in FIG. 2.

For such embodiments, the soft solder 116 may include a lead free solder or an indium-based solder having a tensile strength of about 2 MPa to about 50 MPa. The hard solder 104 may include AuSn solder, AuGe solder and AuSi solder having a tensile strength of about 170 MPa to about 300 MPa, more specifically, about 200 MPa to about 220 MPa. The submount member 100 may be made from a material such as CuW, AlN or BeO having a CTE of about 4 ppm/C to about 7 ppm/C. The CTE matched spacer 108 may also be made from or include a material such as CuW, AlN, BeO, CuMo or a laminated material such as CuMoCu or a metal matrix composite material such as Cu/SiC or the like and have a CTE of about 4 ppm/C to about 10 ppm/C. The pedestal 136 may be made from a soft ductile metal having a high thermal conductivity such as aluminum, annealed copper, OFHC copper or the like with a CTE of about 16 ppm/C to about 20 ppm/C. The housing base member 48 may include a material (which is hard relative to annealed copper or OFHC copper) such as copper-ceramic alloys, zirconium copper and the like having a CTE of about 16 ppm/C to about 20 ppm/C.

Figure 8:
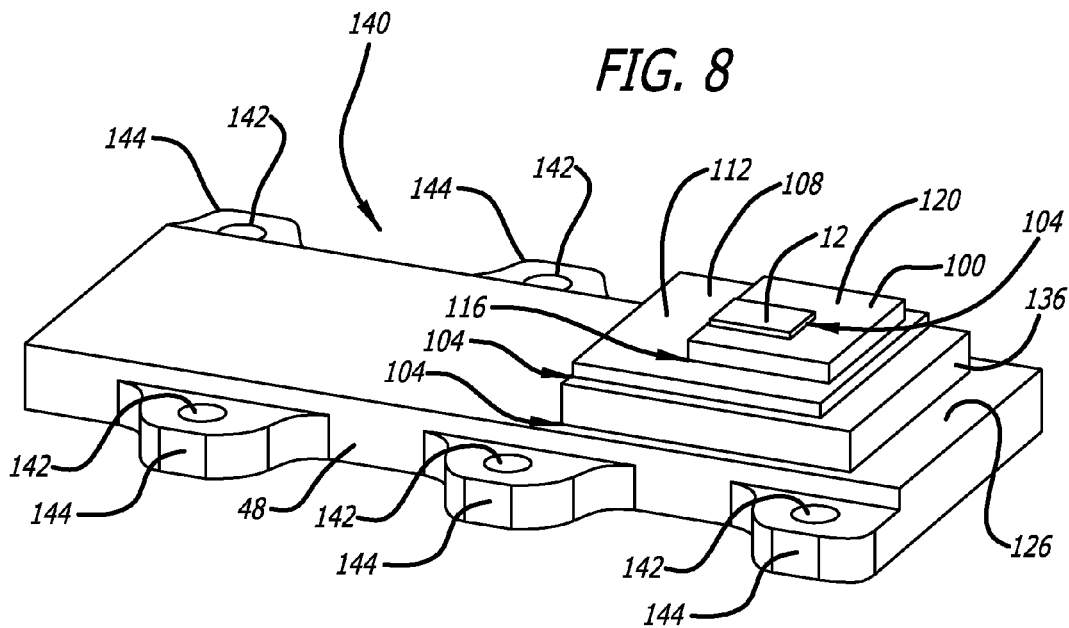
FIG. 8 is a perspective view of a laser module subassembly embodiment.

FIG. 8 shows a perspective view of an embodiment of an optical module sub-assembly 140. The base member 48, which (depending on the mechanic strength requirement of the package) may be either a monolithic metal base with a pedestal or a flat base made from a hard copper alloy or metal matrix as discussed above, also includes a plurality of mounting holes 142 disposed in tabs 144 which extend laterally from the base member 48. Such a configuration of the base member 48 shown in FIG. 8 including mounting holes 142 may be used for any suitable base member embodiment discussed herein. The module sub-assembly 140 includes a CTE matched spacer 108 disposed between a submount 100 and pedestal 136 which may be either a part of a monolithic base 48 as shown in FIGS. 5A and 5B or a soft copper pedestal 136 attached to a flat base 48 as shown in FIG. 8. A laser chip 12 is secured to a top surface 120 of the submount 100. For the embodiment shown, the top surface 112 of the CTE matched spacer 108 is bonded or otherwise secured to a bottom surface 110 of the submount 100 with a soft solder 116 or the like which may serve to keep the temperature of the soldering process under the melt temperature of a hard solder joint. A bottom surface 122 of the CTE matched spacer 108 may be secured to a top surface 138 of the pedestal 136 with a layer of hard adhesive such as hard solder 104. For embodiments having a flat base configuration, the bottom surface 134 of the pedestal 136 may also be secured to a top surface 126 of the base member 48 with a layer of hard adhesive, such as hard solder 104. For some embodiments, the CTE matched spacer 108 may have dimensions that include a width of about 2 mm to about 20 mm, more specifically about 10 mm to about 14 mm and a length of about 2 mm to about 20 mm, more specifically about 14 mm to about 16 mm. In some cases, CTE matched spacer 108 may be made from BeO having a CTE of about 6 ppm/C to about 7 ppm/C at room temperature. The CTE matched spacer 108 may also be made from copper tungsten CuW having a CTE of about 6 ppm/C to about 8 ppm/C and a modulus of about $3.4 \times 10^{11}$ Pa. In some embodiments, the pedestal 136 may have a length of about 2 mm to about 25 mm, more specifically about 15 mm to about 20 mm, a width of about 2 mm to about 25 mm, more specifically about 14 mm to about 16 mm, and a height of about 0.3 mm to about 5 mm, more specifically about 1 mm to about 3 mm. In some cases, the base member 48 may have a length of about 10 mm to about 100 mm, more specifically about 20 mm to about 60 mm, a width of about 10 mm to about 100 mm, more specifically about 12 mm to about 30 mm, and a height of about 1 mm to about 10 mm, more specifically about 1 mm to about 5 mm.

Figure 9:
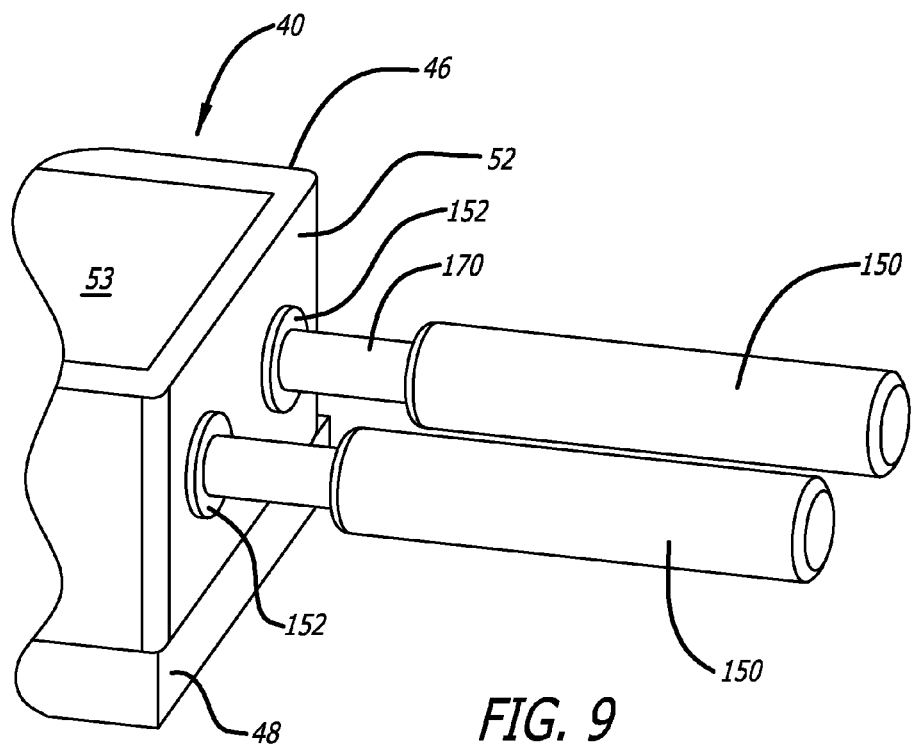
FIG. 9 is a perspective view of a laser module subassembly embodiment including embodiments of stepped electrical contact pins.

Some high power diode laser modules may include single or multiple laser chips(s) 12 packed inside. High output laser chips 12 used for high output laser modules generally require a correspondingly high power electrical energy source in order to operate. This high power electrical current is typically delivered from a power source 200, as shown in FIG. 2, outside an interior volume 53 of the laser module housing 46 to the laser chip or chips 12 disposed within the module housing 46 with two or more conductive pins 150 as shown in FIG. 9. For small diameter conductive pins 150, high current there through may generate large amounts of Ohm heating in the contact area between pins 150 and an external socket. The heat emitted from the pins 150 may jeopardize the laser module performance in some cases, such as by reducing the module energy efficiency (PCE) and may also reduce the laser module reliability. Using thick conductive pins 150 may significantly reduce the Ohm heating in the contact area; however, thick pins may cause difficulties with regard to sealing of the module package. In particular, in many cases, an outside surface of the conductive pin 150 must be mechanically secured and sealed to a module housing 46 with a bushing or washer 152 while also being electrically insulated from the housing 46. Some bushings or washer embodiments 152 that support one or more of these properties may be made from glass or ceramic materials which may be subject to cracking, splitting or other mechanical failure if subjected to excessive stress. As such, stiff thick conductive pins 150 may damage the hermetic feed through sealing due to mechanical stress caused by manipulation of the conductive pins 150 during plug-in and plug-out of electrical terminals from a power source during use. Embodiments configured to address this problem may include conductive pins 150 that vary in transverse dimension along an axial length of the conductive pin.

Some such stepped conductive pin embodiments 150 include conductive pins 150 having two different diameters or transverse dimensions. A thin portion of such a conductive pin 150 may be configured to provide the flexibility and compliance with regard to surrounding structures during the pin plug-in and plug-out. A thick portion of the conductive pin 150 may be configured to provide lower contact resistance for high current laser modules. FIGS. 9-14 illustrate conductive pins 150 having such a configuration. Some embodiments of such an optical module or subassembly thereof, may include a housing wall member 52 for an optical housing, the wall member 52 including an inside surface 154, an outside surface 156 and an aperture 158 extending from the inside surface 154 to the outside surface 156. A conductive pin 150 may pass through the aperture 158 in the housing wall member 52 and be configured to conduct electrical power from a position outside the housing wall member 52 to a position inside the housing wall member 53. Such a conductive pin 150 may include a ductile material with a high electrical conductivity and a first axial section 160 which has a first nominal outer transverse dimension 162 and which passes through the aperture 158 of the housing wall member 52.

Figure 10:
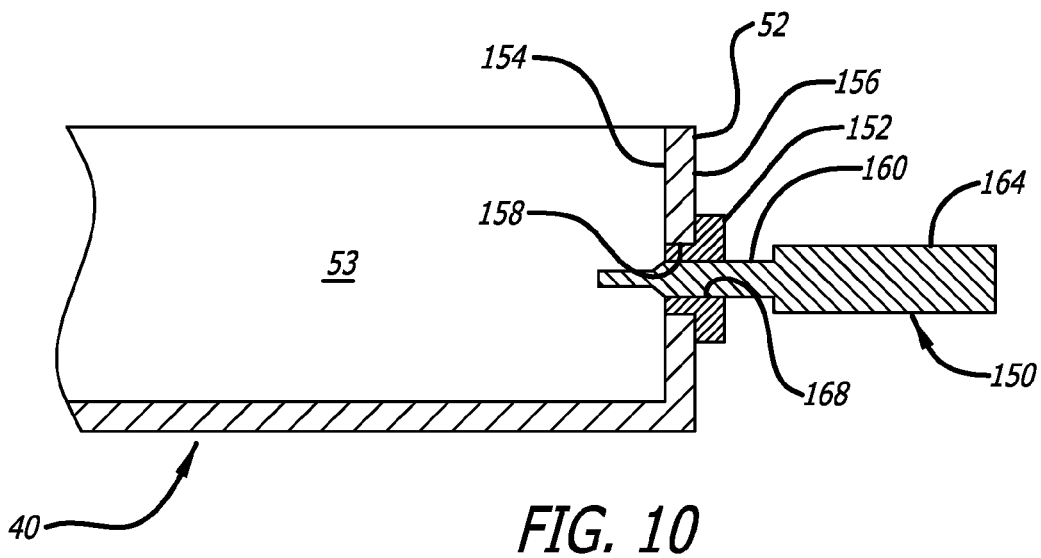
FIG. 10 is an elevation view in partial section of the laser module subassembly embodiment of FIG. 10.
Figure 11:
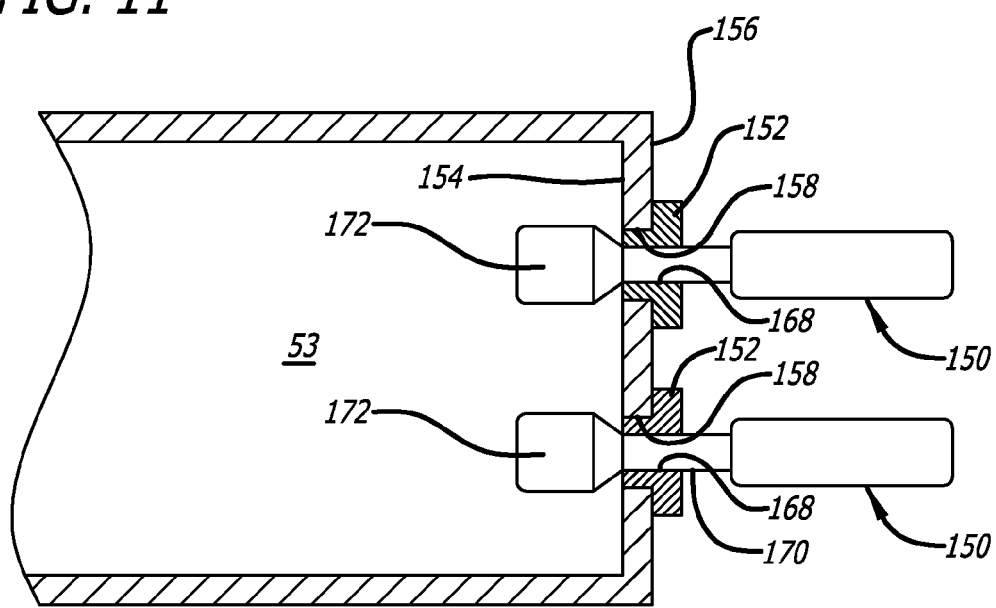
FIG. 11 is a top view in partial section of the laser module subassembly embodiment of FIG. 10 showing the stepped pin configuration.
Figure 12:
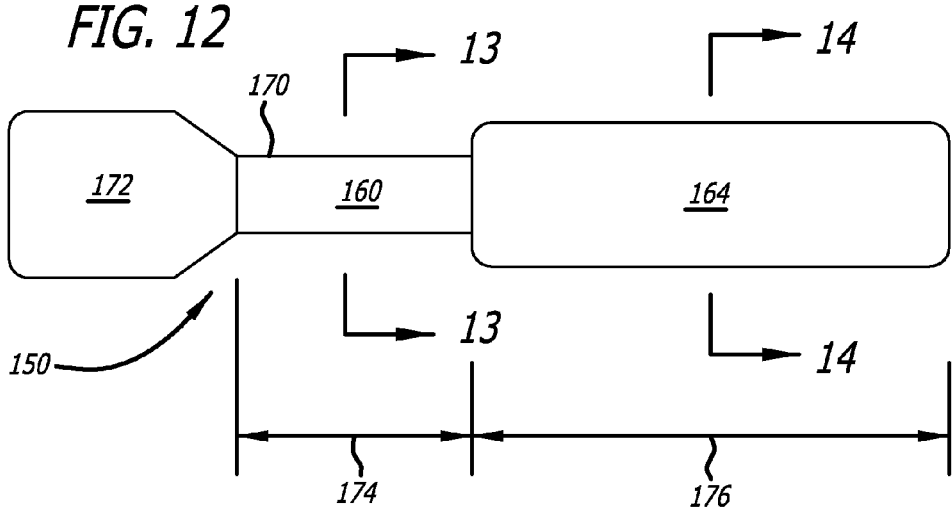
FIG. 12 is a top view of a stepped electrical contact pin embodiment.
Figure 12A:
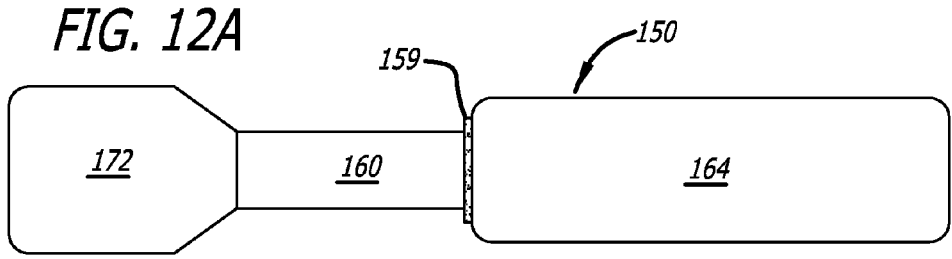
FIG. 12A is a top view of a conductive pin embodiment.
Figure 12B:
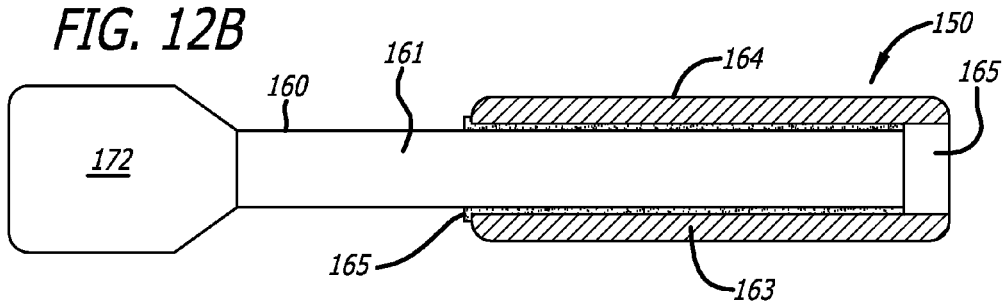
FIG. 12B is a top view of a conductive pin embodiment.
Figure 13:
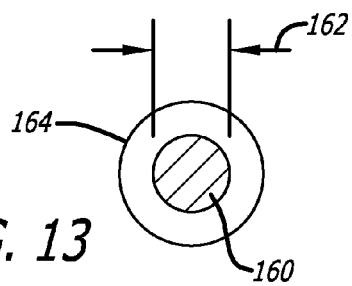
FIG. 13 is a transverse cross section view of the stepped pin embodiment of FIG. 12.
Figure 14:
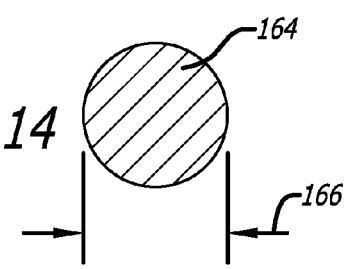
FIG. 14 is a transverse cross section view of the stepped pin embodiment of FIG. 12.

The conductive pin 150 may also include a second axial section 164 which is disposed adjacent to and in electrical communication with the first axial section 160, which includes a second nominal outer transverse dimension 166 that is substantially greater than the first outer transverse dimension 162 of the first axial section 160, which is disposed outside the housing wall member 52, and which is configured for low loss coupling of electrical power thereto. For some embodiments, the module 40 may also include an insulative bushing 152 which is secured to the housing wall member 52, which has an aperture 168 disposed about the first axial section 160 of the conductive pin 150 and which forms a hermetic seal or a portion of a hermetic seal between an outside surface 170 of the first axial section 160 and the wall member. In some cases, the conductive pin 150 may have either a monolithic structure wherein the first axial section 160 and the second axial section 164 are formed from a single piece of continuous ductile material or a composite structure as shown in FIG. 10. For some composite structures, the conductive pin 150 may have two pieces or sections wherein the first axial section 160 has a thin transverse diameter or dimension and the second axial section 164 has a thick transverse diameter or dimension. In some cases, the two or more sections of the conductive pin embodiments may be joined by high temperature brazing, soldering as shown in FIGS. 12A and 12B.

A flattened portion 172 of the conductive pin 150 may be disposed within an interior volume 53 of the housing 46 and may be configured to be secured to an end of an electrical lead (64 or 66 shown in FIG. 2) that is also in electrical communication with the laser chip 12. The optical module subassembly of FIGS. 9-14 may also include any or all of the features, dimensions or materials of the optical module 40 shown in FIG. 2. In addition, any of the features, dimensions or materials of the subassembly shown in FIGS. 9-14 may be incorporated into the module embodiment 40 shown in FIG. 2.

In many cases, the hermetic package housing wall member 52 may be made from a thermally conductive and electrically conductive material and suitable for seam welding seal, such as Kovar, CRS1010 steel and stainless steel. A non-hermetic package housing wall 52 can also be made from other materials, like copper, aluminum or the like. As such, some module embodiments 40 may include an insulative bushing 152 which may be secured to the housing wall member 52, which may have an aperture 168 disposed about the first axial section 160 of the conductive pin 150 and which may form a hermetic seal or a portion of a hermetic seal between an outside surface 170 of the first axial section 160 and the wall member 52. Such an optical module housing embodiment 46 may be configured to provide an interior volume 53 that is hermetically sealed from a surrounding environment. In some cases, the insulative bushing 152, which may be made of a glass or ceramic material, may be directly secured to the outside surface 170 of the conductive pin 150 and directly secured to the wall member 52.

In some cases, the first axial section 160 of the conductive pin 150 may have an axial length 174 of about 3 mm to about 5 mm, an outer transverse dimension 162 of about 1.8 mm to about 2.2 mm and be configured to conduct about 20 amperes of electricity to about 100 amperes of electricity. In some embodiments, the second axial section 164 may have an axial length 176 of about 5 mm to about 15 mm and an outer transverse dimension 166 of about 3 mm to about 5 mm. For some embodiments, the outer transverse dimension 166 of the second axial section 164 may be about 1.5 to about 2.5 times the outer transverse dimension 162 of the first axial section 160. For some embodiments, the conductive pin 150 may include either an alloy 52 or a copper core alloy 52 or a copper alloy such as zirconium copper, or a soft highly conductive pure copper such as annealed OFHC copper and may also have either a monolithic structure wherein the first axial section and the second axial section are formed from a single piece of continuous ductile material (as shown in FIG. 10) or two sections joined together as shown in FIGS. 12A and 12B.

In some cases, the thin first section 160 within the interior volume 53 of the housing 46 may terminate with a flattened section 172 that is configured to facilitate coupling to an electrical lead 64 or 66 which is in turn in electrical communication with a terminal of a laser chip 12 of the system. The thinner portion 160 of the pin 150 may allow for greater flexibility of the pin 150 in the thin section 160 while the thicker section 164 improves electrical transmission to the pin 150 by lowering contact resistance for high power applications. The conductive pin 150 or any axial section 160 or 164 thereof may include a soft highly conductive material such as annealed copper or other materials discussed above. Some pin embodiments may also include an outer layer of a material which has a CTE which substantially matches a CTE of the bushing 152. For example, some pin embodiments may include an outer layer of an alloy with a CTE that substantially matches a CTE of glass, Kovar® or other materials suitable for construction of bushing 152.

For pin embodiments that include a first axial section 160 made of one piece and a second axial section 164 made of a second piece, the pieces or sections may be secured to each other in a variety of ways. FIG. 12A shows an embodiment of a conductive pin 150 made from two separate pieces of conductive material. The first axial section 160 is made from a solid cylindrical piece of conductive material having outer transverse dimension 162 and a transverse cross section which is circular for the embodiment shown. The second axial section 164 is also made from a solid cylindrical piece of conductive material having outer transverse dimension 166 and a circular cross section. An axial end of the first axial section is secured to a corresponding axial end of the second axial section 164 by a butt joint in which the two respective ends are brought into close proximity and secured together with a conductive joint. The butt joint between the first axial section 160 and second axial section 164 may include a brazed or soldered joint as well as any other suitable method. The braze material 159 shown forms a layer of material disposed between the two respective axial ends of the first axial section 160 and second axial section 164. The ends may also be joined by materials such as hard solders 104, soft solders 116 or any other suitable materials or methods.

FIG. 12B shows an embodiment of a conductive pin 150 which is also made from two separate pieces of conductive material which are joined to as to form a first axial section 160 and a second axial section 164. As discussed above, the second axial section 164 has a substantially greater outer transverse dimension than the outer transverse dimension than an outer transverse dimension of the first axial section 160. For the embodiment shown in FIG. 12B, the first axial section is formed from an end portion of a first cylindrical piece of conductive material 161. The second axial section is formed from a second cylindrical piece of conductive material 163 that includes an axial passage 165 disposed through at least a portion of the second cylindrical piece 163. The inside dimension of the axial passage 165 of the second cylindrical piece 163 may be configured to accept an outside surface of the first cylindrical piece 161 with a sufficient gap therebetween to include an agent for securing the two pieces 161 and 163 together in an overlapped configuration. As shown in FIG. 12B, a first end portion of the first cylindrical piece 161 extends axially from the passage 165 of the second cylindrical piece 163 so as to form the first axial section 160. The outside surface of the second cylindrical piece 163 forms the second axial section 164. The outside surface of the first cylindrical piece 161 which is disposed within the axial passage 165 of the second cylindrical piece 163 may be secured to the inside surface of the axial passage 165 of the second cylindrical piece 163 with any suitable conductive bonding agent, including braze 159, hard solder 104, soft solder 116 or any other suitable material or method. The amount of overlap between the first cylindrical piece 161 and axial passage 165 of the second cylindrical piece may vary. The outer transverse dimension of the first cylindrical piece 161 may be the same as the outer transverse dimension of the first axial section 160. The outer transverse dimension of the second cylindrical piece 163 may be the same as the outer transverse dimension of the second axial section 164. Although the first and second pieces 161 and 163 are shown as cylindrical for the embodiment illustrated, other configurations having any other suitable transverse cross section are also contemplated.

Conductive pins, and particularly, conductive pins which are hermetically sealed with glass bushings, or the like, may be a cost effective technology used in high power diode laser modules 40. However, since the tensile strength of sealing glass may be in the range of 20 MPa to about 60 MPa for some specific glass embodiments, which is much lower than that of ceramic material, some large diameter through pin designs may cause stress induced damage to glass bushings such as cracking when being assembled or manipulated by an end user. This may be particularly true with thick stiff conductive pins used in high energy high current flow applications. In addition, due to the poor thermal conductivity of glass, the conductive pin Ohm heating may be problematic for high energy high current flow applications. This may be especially true if thinner pins, such as the stepped pin embodiments 150 discussed above, are used in embodiments such as shown in FIGS. 15 and 16 in order to minimize mechanical stress on glass bushings.

Figure 15:
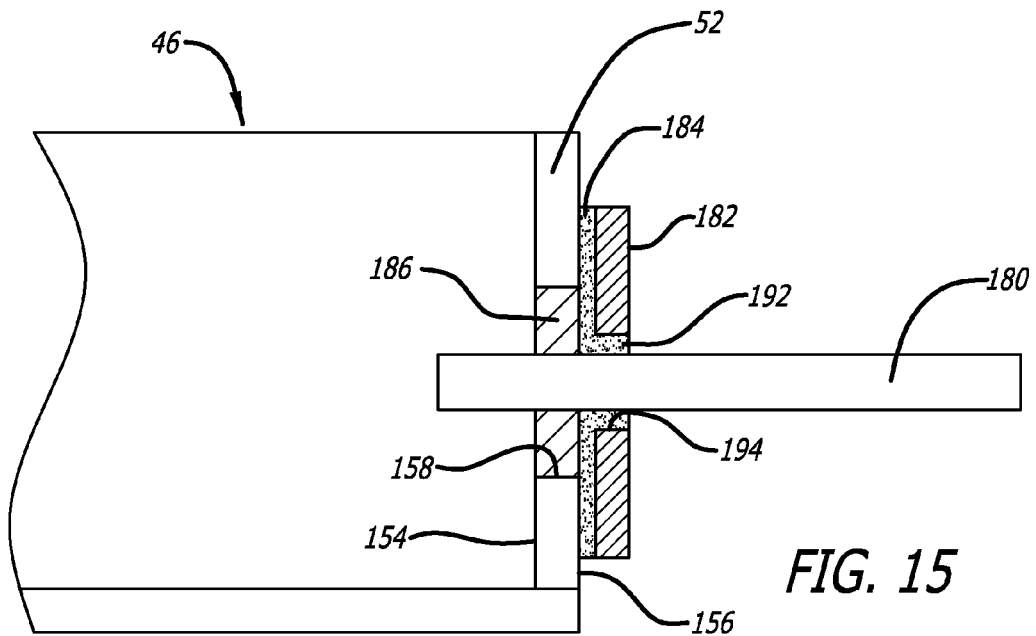
FIG. 15 is an elevation view in partial section of a laser module subassembly including a heat dissipating plate assembly over an electrical contact pin that extends through a wall of a module housing embodiment.
Figure 16:
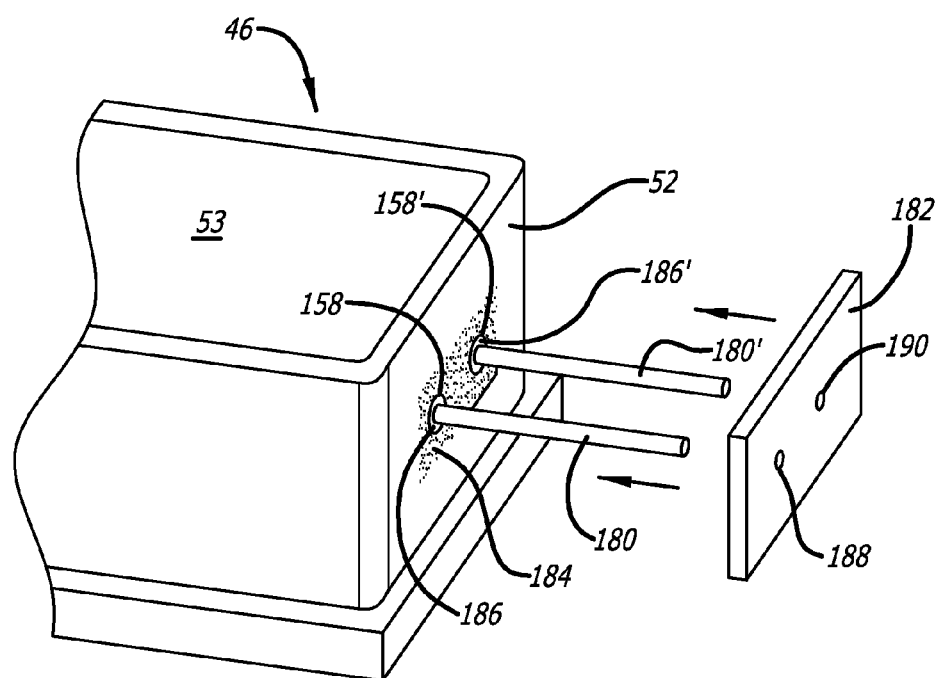
FIG. 16 is a perspective view of a laser module subassembly illustrating the assembly of a heat dissipating plate over electrical contact pins of the module.

Some embodiments of an optical module or sub-assembly of an optical module configured to address these issues may include conductive pins 180 and 180' which are hermetically sealed to a wall member 52 of an optical module by glass material as shown in FIGS. 15 and 16. Such a module embodiment may also include a thermally conductive, electrically insulative, ceramic plate 182 that is in thermal communication with a wall of the module and conductive pins of the module. The plate 182 may be configured to absorb heat emitted from the conductive pins due to Ohmic heating or other sources and distribute the heat energy away from the conductive pins to the wall member of the module housing or surrounding environment outside the module generally. Such a heat dissipating plate 182 may be made from suitable materials such as alumina ($Al_2O_3$) or AlN. The heat dissipating plate 182 may be attached to the conductive pins 180 and wall member 52 of the module housing or package 46 frame/base (outside of the package) with a thermally conductive and electrically insulative epoxy 184. Such a heat dissipating plate 182 may be effective in some cases to significantly dissipate the heat from the conductive pins 180 of the module to the wall member 52 of the module housing 46 and package frame/base generally. Such effective heat dissipation may be effective to increase the current capacity of the conductive pins 180.

Some embodiments of such an optical module or subassembly thereof which incorporate glass bushings 186 and a heat dissipation plate 182 as shown in FIGS. 15 and 16 include a housing wall member 52 for an optical housing 46. The housing wall member 52 may also include an inside surface 54, an outside surface 156 and at least one aperture 158 extending from the inside surface 154 to the outside surface 156. For the embodiment shown, the housing wall member 52 includes a first aperture 158 and a second aperture 158. A first conductive pin 180 of the module passes through the first aperture 158 in the housing wall member 52 and is configured to conduct electrical power from a position outside the housing wall member to a position inside the housing wall member 52. A first insulative glass bushing 186 may be disposed about and in sealed relation with an outside surface of the first conductive pin 180. The first insulative glass bushing 186 may also be in sealed contact with the inside surface of the aperture 158 of the wall member 52 so as to form a hermetic seal or a portion of a hermetic seal between an outside surface of the first conductive pin 180 and the wall member 52.

The module also includes a second conductive pin 180' passing through a second aperture 158' in the housing wall member 52. The second conductive pin 180' may also be configured to conduct electrical power from a position outside the housing wall member 52 to a position inside the housing wall member 52. A second insulative glass bushing 186' may be disposed about and in sealed relation with an outside surface of the second conductive pin 180' and in sealed contact with the wall member 52 so as to form a hermetic seal or a portion of a hermetic seal between an outside surface of the conductive pin 180' and the wall member 52. A ceramic heat dissipation plate 182 which is configured to dissipate heat from an outside surface of the conductive pins 180 and 180' may be disposed in secured relation to the conductive pins 180 and 180' and housing wall member 52. The heat dissipation plate 182 may also include a material having high thermal conductivity. The heat dissipation plate 182 may further include a first aperture 188 which is disposed about an outside surface of the first conductive pin 180 and a second aperture 190 which is disposed about an outside surface of the second conductive pin 180'. The optical module subassembly of FIGS. 15 and 16 may also include any or all of the features, dimensions or materials of the optical module 40 shown in FIG. 2. In addition, any of the features, dimensions or materials of the subassembly shown in FIGS. 15 and 16 may be incorporated into the module embodiment 40 shown in FIG. 2.

The heat dissipation plate 182 may be sized to cover the apertures 158 and 158' of the housing and the glass bushings 186 and 186' disposed between an inside surface of the apertures 158 and 158' and the outside surfaces of the respective conductive pins 180 and 180'. For ceramic heat dissipation plate embodiments 182 which have two or more apertures 188 and 190, the two or more apertures 188 and 190 may be sized and spaced so as to be configured to receive each of the respective two or more conductive pins 180 and 180' disposed therein. For some embodiments, the heat dissipation plate 182 may have a length of about 3 to about 15 mm, a width of about 2 mm to about 10 mm and a thickness of about 0.3 mm to about 2 mm.

In some cases, the heat dissipating plate 182 may be electrically insulative and thermally conductive. In some cases the heat dissipating plate 182 may be secured to the wall member 52 of the housing 46 with an electrically insulative and thermally conductive epoxy 184 such as EP21TCHT-1 epoxy manufactured by Master Bond Inc. located at 154 Hobart Street, Hackensack, N.J. 07601-3922. The aperture or apertures 188 and 190 of the ceramic heat dissipation plate 182 may have an inside transverse dimension that is slightly larger than an outside transverse dimension of an adjacent portion of the conductive pin 180 for some embodiments. The first and second apertures 188 and 190 may be sized to allow passage of the conductive pins 180 and 180' with a gap 192 between an outside surface of the conductive pins 180 and 180' and an inside surface 194 of the respective apertures 188 and 190 which is suitable for bonding between the outside surface of the pin 180 and 180' and inside surface 194 of the aperture 188 and 190 of the insulative plate 182. In some cases, the transverse gap 192 disposed between the outside surface of a conductive pin 180 and 180' and an inside surface of a respective aperture 188 or 190 of the heat dissipation plate 182 may be about 0.05 mm to about 0.5 mm. In some cases, an inside surface of the aperture or apertures 188 or 190 of the heat dissipation plate 182 may be in contact with the outside surface of the conductive pin 180 or 180'.

In certain embodiments, the ceramic material of the ceramic heat dissipation plate 182 comprises a thermal conductivity of about 15 W/m·K to about 200 W/m·K. As discussed above, embodiments of the heat dissipating plate 182 may be made from alumina, aluminum nitride or the like. In certain embodiments, it may be desirable for the conductive pin 180 or 180' to be made from or include a material or outer layer of material having a CTE which is substantially the same as the CTE of the insulative glass bushing 186 or 186' disposed about the conductive pin 180 or 180'. Examples of conductive pin materials that may have a CTE which is substantially the same as the CTE of glass may include VCF-25, Kovar, Alloy 52 or copper core alloy 52. The apertures 158 and 158' in the wall member 52 of the housing 46 may also be sealed to the pin 180 or 180' with one or more bushings or collars in addition to the glass bushings. The additional bushings (not shown) may be made from a variety of suitable materials with controlled thermal expansion, such as iron-nickel-cobalt alloys such as Kovar®, or ceramic materials such as alumina or the like. Some optical module embodiments 40 may include two or more heat dissipating plates 182 which may be configured to be disposed over an individual respective conductive pin 180 or 180', over a plurality of pins or to be layered on other heat dissipating plates 182.

The wall 52 of the hermetic package housing 46 used for some embodiments may include materials such as Kovar, CRS1010 steel, stainless steel or the like. The wall 52 of the non-hermetic package housing used for some embodiments may include other materials such as copper or the like. For some embodiments, the base 48 of the housing 46 may be made from a high strength material such as copper based metal matrix composite, such as copper doped with alumina oxide. Materials such as these, including Glidcop® manufactured by SCM Metal Products, Inc., may be useful to increase resistance of the base to thermal softening and increase high temperature strength.

With regard to the above detailed description, like reference numerals used therein may refer to like elements that may have the same or similar dimensions, materials and configurations. While particular forms of embodiments have been illustrated and described, it will be apparent that various modifications can be made without departing from the spirit and scope of the embodiments of the invention. Accordingly, it is not intended that the invention be limited by the forgoing detailed description.

The entirety of each patent, patent application, publication and document referenced herein is hereby incorporated by reference. Citation of the above patents, patent applications, publications and documents is not an admission that any of the foregoing is pertinent prior art, nor does it constitute any admission as to the contents or date of these documents.

Modifications may be made to the foregoing embodiments without departing from the basic aspects of the technology. Although the technology may have been described in substantial detail with reference to one or more specific embodiments, changes may be made to the embodiments specifically disclosed in this application, yet these modifications and improvements are within the scope and spirit of the technology. The technology illustratively described herein suitably may be practiced in the absence of any element(s) not specifically disclosed herein. Thus, for example, in each instance herein any of the terms "comprising," "consisting essentially of," and "consisting of" may be replaced with either of the other two terms. The terms and expressions which have been employed are used as terms of description and not of limitation and use of such terms and expressions do not exclude any equivalents of the features shown and described or portions thereof and various modifications are possible within the scope of the technology claimed. The term "a" or "an" may refer to one of or a plurality of the elements it modifies (e.g., "a reagent" can mean one or more reagents) unless it is contextually clear either one of the elements or more than one of the elements is described. Although the present technology has been specifically disclosed by representative embodiments and optional features, modification and variation of the concepts herein disclosed may be made, and such modifications and variations may be considered within the scope of this technology.

Certain embodiments of the technology are set forth in the claim(s) that follow(s).

What is claimed is:

1. An optical module or subassembly thereof, comprising:
   a laser chip which includes a low CTE and which includes a bottom surface;
   a submount member which has high thermal conductivity and a low CTE that substantially matches the low CTE of the laser chip and which has a top surface which is secured to the bottom surface of the laser chip;
   a CTE matched spacer member which comprises a CTE that substantially matches the CTE of the submount member, high thermal conductivity, a bottom surface and a top surface which is secured to a bottom surface of the submount;
   a housing base member which comprises high thermal conductivity, a bottom surface that forms an outer boundary of a bottom portion of the module, a material including a high thermal conductivity and a high CTE and a top surface which is secured to the bottom surface of the CTE matched spacer member; and at least one layer of thermally conductive soft adhesive which is disposed between CTE matched elements of the subassembly, which is disposed between the housing base and the laser chip and which has a hardness which is substantially less than the hardness of the CTE matched elements adjacent the layer of soft adhesive;

whereby stresses generated by CTE mismatch between adjacent members are not transmitted to the laser chip through the thermally conductive soft adhesive between the spacer member and submount.

2. The module of claim 1 wherein the thermally conductive soft adhesive is disposed between the submount member and CTE matched spacer member.

3. The module of claim 1 wherein the thermally conductive soft adhesive comprises a yield strength of about 2 MPa to about 50 MPa.

4. The module of claim 1 wherein the soft adhesive forms a bond to adjacent surfaces due to wetting action.

5. The module of claim 1 wherein the soft adhesive comprises a soft solder.

6. The module of claim 5 wherein the soft solder comprises a solder selected from the group consisting of SnAg solder, SnAgCu solder and indium-based solders.

7. The module of claim 1 wherein a hard adhesive is used to secure adjacent members with a substantial CTE mismatch.

8. The module of claim 7 wherein the hard adhesive comprises a hard solder.

9. The module of claim 8 wherein the hard solder comprises a solder selected from the group consisting of AuSn solder, AuGe solder and AuSi solder.

10. An optical module or subassembly thereof, comprising:
a laser chip which comprises a low CTE and which includes a bottom surface;
a submount member which comprises high thermal conductivity, a low CTE that substantially matches the low CTE of the laser chip and which has a top surface which is secured to the bottom surface of the laser chip with a thermally conductive hard solder;
a CTE matched spacer member which comprises high thermal conductivity, a CTE that substantially matches the CTE of the submount member, a bottom surface and a top surface which is secured to a bottom surface of the submount member with a soft solder which has a hardness which is substantially less than a hardness of either the submount member or CTE matched spacer member; and
a housing base member which comprises high thermal conductivity, a bottom surface that forms an outer boundary of a bottom portion of the module, a material including a high thermal conductivity and a high CTE and a top surface which is secured to the bottom surface of the CTE matched spacer member with a thermally conductive hard solder whereby stresses generated by a CTE mismatch between the base and CTE matched spacer member are not transmitted to the laser chip through the soft solder between the spacer member and submount.

11. The module of claim 10 wherein the soft solder comprises a solder selected from a group consisting of SnAg solder, SnAgCu solder and indium-based solders.

12. The module of claim 10 wherein the soft solder comprises a tensile strength of the soft solder is about 2 MPa to about 50 MPa.

13. The module of claim 10 wherein the hard solder comprises a solder selected from the group consisting of AuSn solder, AuGe solder, and AuSi solder.

14. The module of claim 10 wherein the hard solder comprises a tensile strength of about 170 MPa to about 300 MPa.

15. The module of claim 10 wherein the laser chip comprises a high energy laser chip.

16. The module of claim 10 wherein the submount comprises a CTE of about 4 ppm/C to about 7 ppm/C.

17. The module of claim 10 wherein the CTE matching spacer comprises a CTE of about 4 ppm/C to about 10 ppm/C.

18. The module of claim 10 wherein the base member comprises a CTE of about 16 ppm/C to about 20 ppm/C.

19. The module of claim 10 wherein the CTE matched spacer comprises a material selected from the group consisting of CuW, AlN, BeO, CuMo, laminated CuMoCu and metal matrix composite Cu/SiC.

20. The module of claim 10 wherein the base member further comprises a pedestal member extending from a top surface of the base member and including a continuous structure formed from the material of the base member.

21. A method of assembling an optical module or subassembly thereof, comprising:
securing a bottom surface of a laser chip to a top surface of a submount member including a CTE which is substantially the same as the CTE of the laser chip with a hard solder;
securing a bottom surface of CTE matched spacer which includes a CTE that is substantially the same as the laser chip and which has a high thermal conductivity to a top surface of a module base member with a hard solder; and
securing a bottom surface of the submount member to a top surface of the CTE matched spacer with a soft solder, the soft solder having a yield strength which is substantially less than a yield strength of either the submount or CTE matched spacer member.

22. An optical module or subassembly thereof, comprising:
a laser chip which comprises a low CTE and which includes a bottom surface;
a submount member which comprises high thermal conductivity, a low CTE that substantially matches the low CTE of the laser chip and which has a top surface which is secured to the bottom surface of the laser chip with a thermally conductive hard solder;
a CTE matched spacer member which comprises high thermal conductivity, a CTE that substantially matches the CTE of the submount member, a bottom surface and a top surface which is secured to a bottom surface of the submount member with a soft solder which has a hardness which is substantially less than a hardness of either the submount member or CTE matched spacer member;
a pedestal member which comprises a soft alloy material including high thermal conductivity, a CTE substantially higher than the CTE of either the submount member or CTE matched spacer member and a top surface which is secured to the bottom surface of the CTE matched spacer member with a hard solder; and
a housing base member which comprises high thermal conductivity, a bottom surface that forms an outer boundary of a bottom portion of the module, a hardened alloy material including a high thermal conductivity and a high CTE and a top surface which is secured to the bottom surface of the soft alloy pedestal member with a thermally conductive hard solder whereby stresses generated by CTE mismatch between adjacent members of the subassembly are not transmitted to the laser chip through the soft solder between the CTE matched spacer member and submount.

23. The module of claim 22 wherein the soft solder comprises a solder selected from the group consisting of SnAg solder, SnAgCu solder or indium-based solders.

24. The module of claim 22 wherein the soft solder comprises a tensile strength of the soft solder is about 2 MPa to about 50 MPa.

25. The module of claim 22 wherein the hard solder comprises a solder selected from the group consisting of AuSn solder, AuGe solder, and AuSi solder.

26. The module of claim 22 wherein the hard solder comprises a tensile strength of about 170 MPa to about 300 MPa.

27. The module of claim 22 wherein the laser chip comprises a high energy laser chip.

28. The module of claim 22 wherein the submount member comprises a CTE of about 4 ppm/C to about 7 ppm/C.

29. The module of claim 22 wherein the submount member comprises a material selected from the group consisting of CuW, AlN, BeO, and CuMo.

30. The module of claim 22 wherein the CTE matched spacer comprises a CTE of about 4 ppm/C to about 10 ppm/C.

31. The module of claim 22 wherein the CTE matched spacer comprises a material selected from the group consisting of CuW, AlN, BeO, CuMo laminated CuMoCu and metal matrix composite Cu/SiC.

32. The module of claim 22 wherein the pedestal member comprises a CTE of about 16 ppm/C to about 20 ppm/C.

33. The module of claim 22 wherein the pedestal member comprises a material selected from the group consisting of annealed copper and OFHC copper.

34. The module of claim 22 wherein the housing base member comprises a CTE of about 16 ppm/C to about 20 ppm/C.

35. The module of claim 22 wherein the housing base member comprises a material selected from the group consisting of copper-ceramic alloys, and zirconium copper.

36. A method of assembling an optical module or subassembly thereof, comprising:
   securing a bottom surface of a laser chip to a top surface of a submount member including a CTE which is substantially the same as the CTE of the laser chip with a hard solder;
   securing a bottom surface of a soft alloy pedestal member which has a high thermal conductivity to a top surface of a hard alloy module base member with a hard solder or braze;
   securing a bottom surface of CTE matched spacer member which includes a CTE that is substantially the same as the laser chip and which has a high thermal conductivity to a top surface of the soft alloy pedestal member with a hard solder; and
   securing a bottom surface of the submount member to a top surface of the CTE matched spacer with a soft solder, the soft solder having a low melt point and yield strength which is substantially less than a yield strength of either the submount or CTE matched spacer member.

* * * * *